United States Patent
Guo et al.

(10) Patent No.: US 12,261,112 B2
(45) Date of Patent: Mar. 25, 2025

(54) SIGNAL LINES IN MEMORY DEVICES AND METHODS FOR FORMING THE SAME

(71) Applicant: WUXI SMART MEMORIES TECHNOLOGIES CO., LTD., Wuxi (CN)

(72) Inventors: Meilan Guo, Wuxi (CN); Yushi Hu, Wuxi (CN); Ke Ma, Wuxi (CN); Jia Sun, Wuxi (CN); Yu Long, Wuxi (CN)

(73) Assignee: WUXI SMART MEMORIES TECHNOLOGIES CO., LTD., Wuxi (CN)

( * ) Notice: Subject to any disclaimer, the term of this patent is extended or adjusted under 35 U.S.C. 154(b) by 444 days.

(21) Appl. No.: 17/717,250

(22) Filed: Apr. 11, 2022

(65) Prior Publication Data

US 2022/0328396 A1 Oct. 13, 2022

(30) Foreign Application Priority Data

Apr. 12, 2021 (CN) .......................... 202110386255.6

(51) Int. Cl.
*H01L 23/528* (2006.01)
*H01L 27/11507* (2017.01)
*H10B 53/30* (2023.01)

(52) U.S. Cl.
CPC .......... *H01L 23/528* (2013.01); *H10B 53/30* (2023.02)

(58) Field of Classification Search
CPC . G11C 11/221; H01L 23/5221; H01L 23/528; H01L 23/481; H01L 27/0207; H01L 21/76838; H10B 53/10; H10B 53/30
See application file for complete search history.

(56) References Cited

U.S. PATENT DOCUMENTS

| 5,357,051 A | 10/1994 | Hwang |
| 6,433,272 B1 | 8/2002 | Buhler et al. |
| 6,951,978 B1 | 10/2005 | Norman |

(Continued)

FOREIGN PATENT DOCUMENTS

| CN | 1293454 A | 5/2001 |
| CN | 1444229 A | 9/2003 |
| CN | 1945735 A | 4/2007 |

OTHER PUBLICATIONS

Office Action in related Chinese Application No. 2021103862556, dated Apr. 4, 2021 (3 pages).

*Primary Examiner* — Victor A Mandala
*Assistant Examiner* — Lawrence C Tynes, Jr.
(74) *Attorney, Agent, or Firm* — Bayes PLLC

(57) ABSTRACT

A memory device includes a bit line group having a first bit line and a second bit line. The bit line group includes a first segment, a second segment, and a twist segment conductively connected to the first segment and the second segment. The first segment includes a first portion of the first bit line and a first portion of the second bit line. The second segment includes a second portion of the first bit line and a second portion of the second bit line. The twist segment includes a third portion of the first bit line and a third portion of the second bit line. The first and second portions of the first bit line and the second bit line each extends in a first lateral direction. The third portion of the first bit line is conductively connected to the first and second portions of the first bit line.

18 Claims, 9 Drawing Sheets

(56) References Cited

U.S. PATENT DOCUMENTS

| | | | |
|---|---|---|---|
| 2006/0092748 A1* | 5/2006 | Miyakawa | G11C 11/22 365/230.03 |
| 2006/0121790 A1 | 6/2006 | Hashim | |
| 2010/0044093 A1 | 2/2010 | Moazzami et al. | |
| 2010/0200276 A1 | 8/2010 | Karikalan | |

* cited by examiner

SIGNAL LINES IN MEMORY DEVICES AND METHODS FOR FORMING THE SAME

CROSS-REFERENCE TO RELATED APPLICATIONS

This application claims priority to Chinese Patent Applications No. 202110386255.6, filed on Apr. 12, 2021, which is incorporated herein by reference in is entirety.

BACKGROUND

Embodiments of the present disclosure relate to signal lines in memory devices, e.g., ferroelectric memory devices, and methods for forming the signal lines.

Ferroelectric memory, such as ferroelectric RAM (Fe-RAM or FRAM), uses a ferroelectric material layer to achieve non-volatility. A ferroelectric material has a nonlinear relationship between the applied electric field and the apparent stored charge and thus, can switch polarity in an electric field. Ferroelectric memory's advantages include low power consumption, fast write performance, and great maximum read/write endurance.

BRIEF SUMMARY

Embodiments of signal lines in memory devices and methods for forming the signal lines are disclosed herein.

Embodiments of the present disclosure provide a memory device. The memory device includes a bit line group having a first bit line and a second bit line. The bit line group includes a first segment, a second segment, and a twist segment conductively connected to the first segment and the second segment. The first segment includes a first portion of the first bit line and a first portion of the second bit line. The second segment includes a second portion of the first bit line and a second portion of the second bit line. The twist segment includes a third portion of the first bit line and a third portion of the second bit line. The first and second portions of the first bit line and the second bit line each extends in a first lateral direction. The third portion of the first bit line is conductively connected to the first and second portions of the first bit line, and the third portion of the second bit line is conductively connected to the first and second portions of the second bit line. The third portion of the first bit line extends in a second lateral direction different from the first lateral direction. The third portion of the second bit line extends in a third lateral direction different from the first lateral direction and the second lateral direction.

In some embodiments, the memory device further includes a first plurality of memory cells coupled to the first bit line and a second plurality of memory cells coupled to the second bit line. The first plurality of memory cells are each configured to store a "0," and the second plurality of memory cells are each configured to store a "1."

In some embodiments, the memory device further includes a second bit line group comprising a third bit line and a fourth bit line. The second bit line group includes a first segment, a second segment, and a twist segment conductively connected to the first segment and the second segment. The first segment includes a first portion of the third bit line and a first portion of the fourth bit line, the second segment includes a second portion of the third bit line and a second portion of the fourth bit line, and the twist segment includes a third portion of the third bit line and a third portion of the fourth bit line. The first and second portions of the third bit line and the fourth bit line each extends in the first lateral direction. The third portion of the third bit line is conductively connected to the first and second portions of the third bit line, and the third portion of the fourth bit line is conductively connected to the first and second portions of the fourth bit line. The third portion of the third bit line extends in the second lateral direction. The third portion of the fourth bit line extends in the third lateral direction. The twist segment of the bit line group and the twist segment of the second bit line group are staggered in the first lateral direction.

In some embodiments, the bit line group and the second bit line group are adjacent to each other in a fourth lateral direction perpendicular to the first lateral direction.

In some embodiments, the bit line group further includes a second twist segment coupled to the second segment. The second twist segment includes a fourth portion of the first bit line and a fourth portion of the second bit line. The fourth portion of the first bit line is coupled to the second portion of the first bit line and extends in the third lateral direction, and the fourth portion of the second bit line is coupled to the second portion of the second bit line and extends in the second lateral direction. The second twist segment of the bit line group and the twist segment of the second bit line group are staggered in the first lateral direction.

In some embodiments, the second bit line group further includes a second twist segment coupled to the second segment, the second twist segment comprising a fourth portion of the third bit line and a fourth portion of the fourth bit line. The fourth portion of the third bit line is coupled to the second portion of the third bit line and extends in the third lateral direction, and the fourth portion of the fourth bit line is coupled to the second portion of the fourth bit line and extends in the second lateral direction. The second twist segment of the second bit line group is staggered with each of the twist segment and the second twist segment of the bit line group in the first lateral direction.

In some embodiments, the memory device further includes a third bit line group having a fifth bit line and a sixth bit line. The third bit line group includes a first segment, a second segment, and a twist segment conductively connected to the first segment and the second segment. The first segment includes a first portion of the fifth bit line and a first portion of the sixth bit line, the second segment includes a second portion of the fifth bit line and a second portion of the sixth bit line, and the twist segment includes a third portion of the fifth bit line and a third portion of the sixth bit line. The first and second portions of the fifth bit line and the sixth bit line each extends in the first lateral direction. The third portion of the fifth bit line is conductively connected to the first and second portions of the fifth bit line, and the third portion of the sixth bit line is conductively connected to the first and second portions of the sixth bit line. The third portion of the fifth bit line extends in the second lateral direction. The third portion of the sixth bit line extends in the third lateral direction. The twist segment of the third bit line group is staggered with each of the twist segment of the bit line group, the second twist segment of the bit line group, the twist segment of the second bit line group, and the second twist segment of the second bit line group in the first lateral direction.

In some embodiments, the bit line group further includes a seventh bit line adjacent to at least one of the first bit line or the second bit line. The first segment includes a first portion of the seventh bit line. The second segment includes a second portion of the seventh bit line, and the twist segment includes a third portion of the seventh bit line. The first and second portions of the seventh bit line each extends in the first lateral direction. The third portion of the seventh bit line is conductively connected to the first and second portions of the seventh bit line, the third portion of the seventh bit line extending in the third lateral direction.

In some embodiments, the memory device further includes at least one dummy bit line extending in the first lateral direction. The at least one dummy bit line is adjacent to the bit line group in a fourth lateral direction perpendicular to the first lateral direction.

In some embodiments, the at least one dummy bit line includes a dummy bit line on both sides of the bit line group in the fourth lateral direction.

In some embodiments, the third portion of the first bit line and the third portion of the second bit line are insulated to each other, and are each at a respective elevation in a vertical direction perpendicular to the first lateral direction.

Embodiments of the present disclosure provides a semiconductor device. The semiconductor device includes a first signal line and a second signal line. The first signal line and the second signal line include a first segment, a second segment, and a twist segment conductively connected to the first segment and the second segment. The first segment includes a first portion of the first signal line and a first portion of the second signal line. The second segment includes a second portion of the first signal line and a second portion of the second signal line. The twist segment includes a third portion of the first signal line and a third portion of the second signal line. The third portion of the first signal line is conductively connected to the first and second portions of the first signal line, and the third portion of the second signal line is conductively connected to the first and second portions of the second signal line. The third portion of the first signal line and the third portion of the second signal line each extends in a different lateral direction and being insulated from each other. Projections of the third portions of the first signal line and the second signal intersect with each other on a lateral plane.

In some embodiments, the one of the third portion of the first signal line and the third portion of the second signal line is located in a first plane, and another one of the third portion of the first signal line and the third portion of the second signal line is located in a second plane different from first plane.

In some embodiments, the first plane includes a metal layer in which the first and second portions of the first signal line and the second signal line are located. In some embodiments, the second plane includes at least one of a second metal layer different from the first metal layer, or a conductive layer on a substrate.

In some embodiments, the conductive layer includes at least one of a doped region on the substrate, a silicide layer on the substrate, or a layer of gate electrode material of a transistor on the substrate.

In some embodiments, the first and second portions of the first signal line and the second signal line each extends in a second lateral direction different from the lateral direction.

In some embodiments, the first signal line and the second signal line are bit lines.

Embodiments of the present disclosure provides a memory device. The memory device includes a bit line group having a first bit line and a second bit line each extending in a first lateral direction. The first bit line and the second bit line are intertwined with each other at a first location. In a second lateral direction perpendicular to the first lateral direction, the first bit line includes at least a first portion above the second bit line, and at least a second portion below the second bit line.

In some embodiments, the memory device further includes a second bit line group comprising a third bit line and a fourth bit line each extending in the first lateral direction. The third bit line and the fourth bit line are intertwined with each other at a second location. In the second lateral direction perpendicular to the first lateral direction, the third bit line includes at least a first portion above the fourth bit line, and at least a second portion below the fourth bit line. The second location is staggered with the first location in the first direction.

In some embodiments, the memory device further includes at least one dummy bit line adjacent to the bit line group in the second lateral direction.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
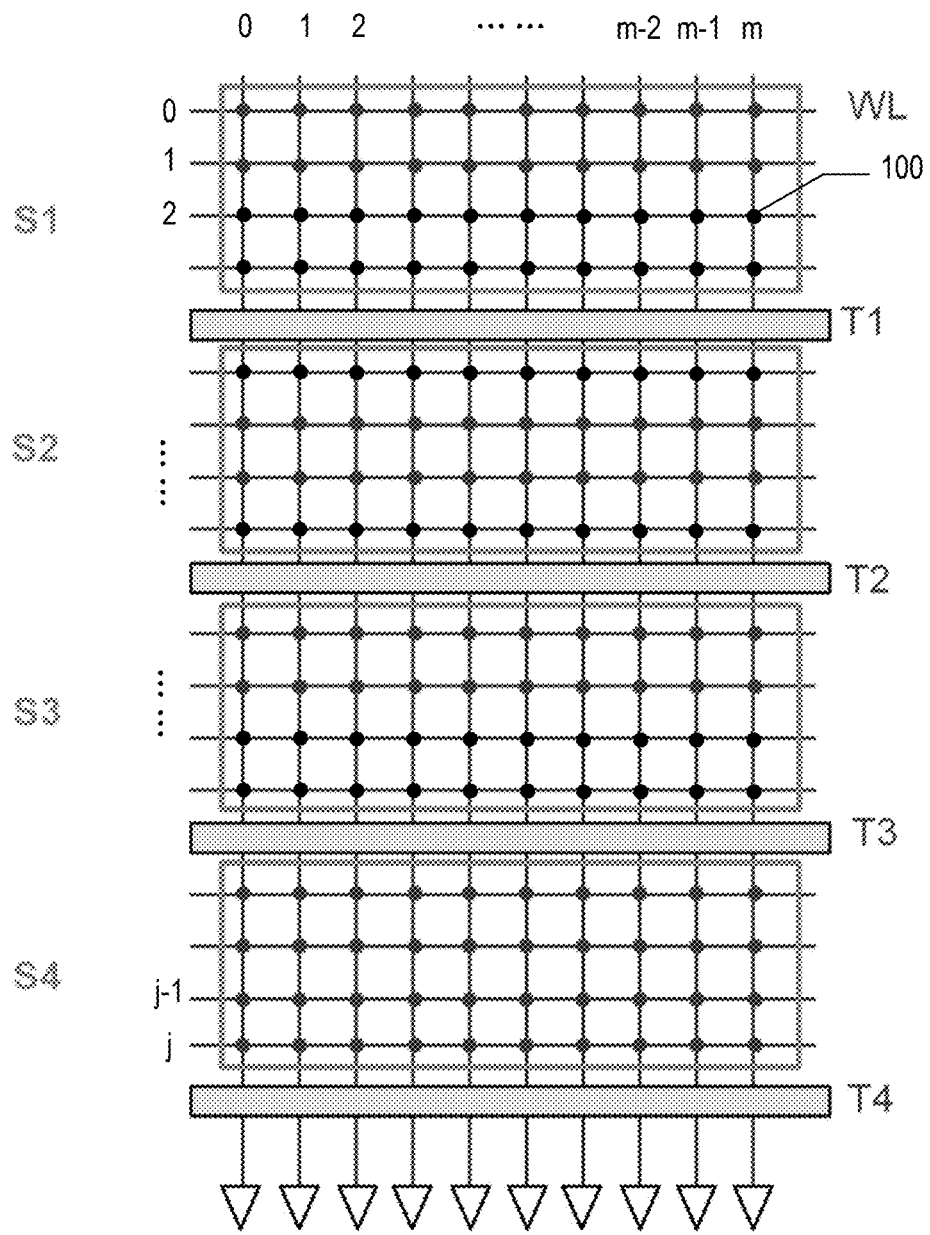
FIG. 1A illustrates a circuit diagram of an exemplary arrangement of a plurality of bit lines and a plurality of word lines in a ferroelectric memory device, according to some embodiments of the present disclosure.
Figure 1A:
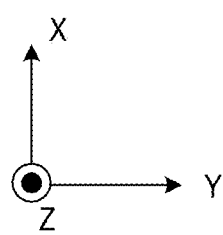

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

A ferroelectric memory device includes ferroelectric memory cells coupled to often a large number of various signal lines for transmitting electrical signals. Examples of the signal lines include bit lines, word lines, and plate lines. These signal lines are often compactly arranged in a pattern in a memory chip. Signal lines transmitting different data can be arranged interleavingly. For example, in a ferroelectric memory device having 2T-2C cells, memory data is transmitted in pairs (e.g., "0" "1" or "1" "0") in signal lines, e.g., bit lines. A signal line transmitting "1" is between/adjacent to two signal lines transmitting "0s," and a signal one transmitting "0" is between/adjacent to two signal lines transmitting "1s." Because the data voltage of "1" is higher than the data voltage of "0" by tens or hundreds of millivolts (mV), one issue of a ferroelectric memory device is, the compact arrangement of signal lines and the data pattern difference in the signal lines can cause circuit mismatch in signal lines, especially in adjacent signal lines. Bit fail rate can increase. Another issue includes, signal lines, e.g., bit lines, located at (or close to) the edge of the pattern often have different shapes/widths than those located in (or close to) the center of the pattern. The differences in shapes/widths can be a result of loading effect during the fabrication process. These differences can cause the parasitic resistance between adjacent bit lines to vary. As a result of both issues, the data voltages transmitted in signal lines can be impacted. The data voltages can be more susceptible to non-uniformity.

Various embodiments in accordance with the present disclosure provide signal line arrangement configured to balance out or reduce voltage mismatch/non-uniformity. As examples, bit line arrangements in ferroelectric memory devices are illustrated. In the present disclosure, the bit lines include one or more bit line groups. Each bit line group includes at least two bit lines extend in a lateral direction and are intertwined. One or more twist segments can be formed in a bit line group. In some embodiments, the bit lines include two or more bit line groups, and the twist segments of adjacent bit line groups are staggered in the lateral direction such that the orthogonal projections of the twist segments are separated in the lateral direction. The number of twist segments in a bit line group can be even or odd. In some embodiments, the number of bit lines in a bit line group can be 2, 3, or more. In some embodiments, one or more dummy bit lines can be arranged at an edge of the pattern.

A twist segment can be formed by the bit lines, in the same bit line group, all changing the directions they extend, in a range. On a lateral plane in which the bit lines extend, the orthogonal projections of the bit lines cross with one another in the range. In a vertical direction perpendicular to the lateral plane, the bit lines can be disposed at different elevations/planes, such that the bit lines are electrically isolated from one another. In some embodiments, in a bit line group, one bit line has a portion in a plane that is above or below the rest of the bit lines, while the rest of the bit lines are disposed on a same plane (e.g., a metal layer). The portion can be formed from another metal layer above or below the metal layer, or a conductive region on/in the substrate. In some embodiments, the conductive region includes a doped region in the substrate, a metal silicide layer in the substrate, and/or the same conductive layer from which the gate conductors of transistors are formed.

Figure 1B:
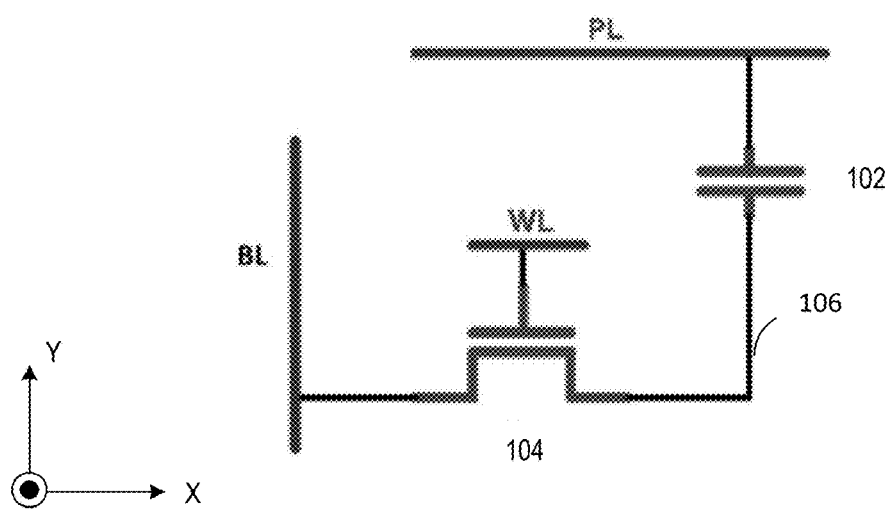
FIG. 1B illustrates a circuit diagram of a ferroelectric memory cell, according to some embodiments of the present disclosure.
Figure 1C:
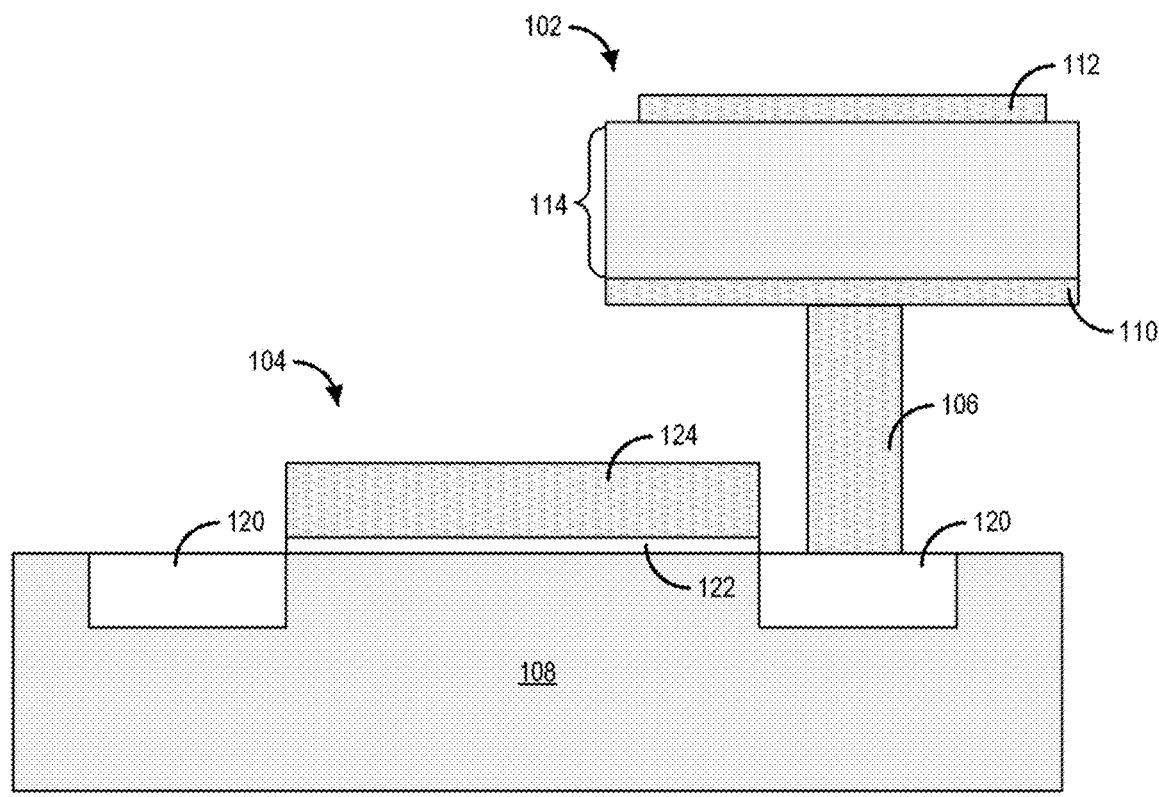
FIG. 1C illustrates a cross-section of an exemplary ferroelectric memory cell, according to some embodiments of the present disclosure.

FIG. 1A illustrates an exemplary arrangement of bit lines, word lines, and ferroelectric memory cells in a ferroelectric memory device, according to embodiments of the present disclosure. FIG. 1B illustrates a circuit diagram of an exemplary ferroelectric memory cell, according to embodiments of the present disclosure. FIG. 1C illustrates a detailed structure of a ferroelectric memory cell, according to embodiments of the present disclosure. For ease of illustration, bit lines ("BL") and word lines ("WL") are arranged to extend in different directions. For example, the bit lines may extend in the x-direction, and the word lines may extend in the y-direction. T1, T2, T3, and T4 may each represent a range in which one or more twist segments are disposed in the bit lines. S1, S3, S3, and S4 may each represent a range in which no twist segment is disposed. "CIRCUIT" represents any devices/circuitry electrically coupled to the bit lines and/or word lines. It should be noted that, FIG. 1A is shown to merely illustrate the couplings amongst elements, and is not meant to indicate the actual structure or locations of the elements. It should also be noted that, the number of signal lines (e.g., bit lines, word lines) and the numbers of segments (e.g., T1-T4, and S1-S4) shown in the figures of the present disclosure is for illustration purposes only, and are not intended to indicate the actual number of signal lines or segments in an actual ferroelectric memory device. For ease of illustration, FIGS. 1A, 1B, and 1C are described together.

FIG. 1A illustrates a plurality of (e.g., m) bit lines and a plurality of (e.g., j) word lines. The bit lines may transmit data to circuit. The numbers of signal lines, i.e., m and j, may each be a positive integer greater than 0. The coupling between a bit line and a word line may form a ferroelectric memory cell 100, which is represented by a dot in FIG. 1A. In some embodiments, each of the m bit lines is electrically coupled to j ferroelectric memory cells 100, ad each of the j word lines is electrically coupled to m ferroelectric memory cells 100. The m bit lines and j word lines may include any suitable conductive material such as tungsten, aluminum, copper, cobalt, silicides, and/or polysilicon. The m bit lines may further be coupled to a follower circuit, which can include any device for further processing and/or storing the memory data, such as a driving circuit having a sense amplifier and/or a multiplexer.

FIG. 1B illustrates a circuit diagram of ferroelectric memory cell 100, according to embodiments of the present disclosure. Ferroelectric memory cell 100 is the storage element of a ferroelectric memory device and can include various designs and configurations. For ease of description, the example of a 2D ferroelectric memory device, e.g., a 1T-1C cell, is illustrated in the present disclosure. In various embodiments, ferroelectric memory cell 100 may be any other suitable types of memory cell with more than one capacitor per cell. For example, ferroelectric memory cell may be a "2T-2C" cell or an "nT-mC" (where n and m are integers) cell. In some other embodiments, ferroelectric memory cell 100 may be the storage element of a 3D ferroelectric memory device. The type of memory cells (e.g., the number of capacitors in a single memory cell) should not be limited by the embodiments of the present disclosure. As shown in FIG. 1B, ferroelectric memory cell 100 may include a capacitor structure 102 and a transistor 104. Capacitor structure 102 may be electrically coupled to a plate line ("PL") and transistor 104, and transistor 104 may be electrically coupled to a word line and a bit line. In some embodiments, a plurality of ferroelectric memory cells 100 share the same plate line.

FIG. 1C illustrates a cross-section of an exemplary ferroelectric memory cell 100, according to some embodiments of the present disclosure. As shown in FIG. 1C, ferroelectric memory cell 100 includes a capacitor structure 102, a transistor 104, and an interconnect 106 between capacitor structure 102 and transistor 104 formed on a substrate 108. Substrate 108 can include silicon (e.g., single crystalline silicon), silicon germanium (SiGe), gallium arsenide (GaAs), germanium (Ge), silicon on insulator (SOI) or any other suitable materials.

In some embodiments, capacitor structure 102 includes a lower electrode 110, an upper electrode 112, and a ferroelectric layer 114 disposed vertically between lower electrode 110 and upper electrode 112. Ferroelectric layer 114 may be in contact with and electrically connected to lower electrode 110 on a lower surface and in contact with and electrically connected to upper electrode 112 on an upper surface. Lower electrode 110 can be electrically connected to transistor 104 through interconnect 106, and upper electrode 112 can be electrically connected to a voltage source (e.g., plate line "PL"), such that an electrical field can be applied to ferroelectric layer 114.

The materials of lower electrode 110 and upper electrode 112 can include, but not limited to, at least one of titanium nitride (TiN), titanium silicon nitride (TiSiN$_x$), titanium aluminum nitride (TiAlN$_x$), titanium carbon nitride (TiCN$_x$), tantalum nitride (TaN$_x$), tantalum silicon nitride (TaSiN$_x$), tantalum aluminum nitride (TaAlN$_x$), tungsten nitride (WN$_x$), tungsten silicide (WSi$_x$), tungsten carbon nitride (WCN$_x$), ruthenium (Ru), ruthenium oxide (RuO$_x$), iridium (Ir), doped polysilicon, transparent conductive oxides (TCO), or iridium oxide (IrO$_x$). In some embodiments, lower electrode 110 and/or upper electrode include TiN and/or TaN$_x$. In some embodiments, lower electrode 110 and upper electrode 112 include the same material(s). In some other embodiments, lower electrode 110 and upper electrode 112 include different materials.

The thickness of lower electrode 110 or upper electrode 112 can be between about 2 nm and about 50 nm, such as between 2 nm and 20 nm (e.g., 2 nm, 3 nm, 4 nm, 5 nm, 8 nm, 10 nm, 15 nm, 18 nm, 20 nm, 25 nm, 30 nm, 35 nm, 40 nm, 45 nm, 50 nm, any range bounded on the lower end by any of these values, or in any range defined by any two of these values). In some embodiments, lower electrode 110 and upper electrode 112 have the same thickness. In some embodiments, lower electrode 110 and upper electrode 112 have different thicknesses.

In some embodiments, ferroelectric layer 114 includes a ferroelectric oxide material. The ferroelectric oxide may be doped with a plurality of dopants, which can improve ferroelectric film crystallization. For example, the dopants may provide elasticity during the crystallization of the doped ferroelectric layer, reducing the number of defects formed in the ferroelectric film crystallization, and improving high-K ferroelectric phase formation. It is understood that in some embodiments, ferroelectric layer 114 can include a multi-layer structure.

The ferroelectric oxide material can include a ferroelectric composite oxide. In some embodiments, the ferroelectric oxide material includes oxygen and one or more ferroelectric metals. The ferroelectric metals can include, but not limited to, zirconium (Zr), hafnium (Hf), and titanium (Ti), aluminum (Al), In some embodiments, the ferroelectric oxide material includes oxygen and two or more ferroelectric metals. In some embodiments, the ferroelectric oxide material includes oxygen and a non-metal material such as silicon (Si).

Optionally, ferroelectric layer 114 may also include a plurality of dopants formed as a part of the crystal structures. In some embodiments, the dopants compensate for the defects formed during the crystallization of the ferroelectric oxide material to improve the film quality of ferroelectric layer 114. In some embodiments, the dopants are different from the ferroelectric metals in the ferroelectric oxide material and include one or more dopants from one or more of Hf, Zr, Ti, Al, S1, hydrogen (H), oxygen (O), vanadium (V), niobium (Nb), tantalum (Ta), yttrium (Y), and/or lanthanum (La).

In some embodiments, transistor 104 includes source/drain regions 120 and a gate stack having a gate dielectric 122 and a gate conductor 124. Source/drain regions 120 can be doped portions in substrate 108 with n-type or p-type dopants at a desired doping level. Gate dielectric 122 can include dielectric materials, such as silicon oxide ($SiO_x$), silicon nitride ($SiN_x$) or high-k dielectric materials including, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), or any combination thereof. Gate conductor 124 can include conductive materials including, but not limited to, tungsten (W), cobalt (Co), copper (Cu), Al, polysilicon, silicides, or any combination thereof. Gate conductor 124 can be electrically coupled to the word line of ferroelectric memory cell 100. The word line is configured to apply a respective word line voltage on gate conductor 124 of transistor 104. An interconnect (not shown) can be in contact with one of source/drain regions 120 that is not in contact with interconnect 106 and be electrically coupled to the bit line of ferroelectric memory cell 100. The bit line is configured to apply a respective bit line voltage on source/drain 120 of transistor 104. By applying word line voltage and bit line voltage on transistor 104, the operations, e.g., read, erase, program, of ferroelectric memory cell 100 may be controlled.

Although not shown, in some embodiments, ferroelectric memory cell 100 can also include a capacitor structure that is the storage element, e.g., a memory string, of a 3D ferroelectric memory device. The capacitor structure may include a conductor layer, a second electrode, a ferroelectric layer, and a first electrode disposed radially from the center of capacitor structure in this order. That is, the ferroelectric layer can be disposed radially between the second electrode and the first electrode. The conductor layer fills the remaining area inside the second electrode and includes a conductor material, such as a metal. The material of the ferroelectric layer, the second electrode, and the first electrode may be similar to the ferroelectric layer, the upper electrode, and the lower electrode. In some embodiments, the ferroelectric layer, the second electrode, and the first electrode may each have a "U" shape.

Referring back to FIG. 1A, each of the m bit lines may be coupled to a plurality of, e.g., j, ferroelectric memory cells 100. Ferroelectric memory cells 100 coupled to the same bit line may store the same data, e.g., "0s" or "1s." An adjacent bit line may be coupled to ferroelectric memory cells 100 stored with different data. For example, bit line (m−1) may be coupled to ferroelectric memory cells stored with "0s," and bit lines m and (m+1) may each be coupled to ferroelectric memory cells stored with "1s," and vice versa. In some embodiments, each bit line is coupled to j ferroelectric memory cells 100, each stored with the same data, "0" or "1." To store data, capacitor structure 102 of a respective ferroelectric memory cell 100 may store a respective electric charge by charging capacitor structure 102. The bit line coupled to ferroelectric memory cell 100 may transmit a respective voltage such that capacitor structure 102 can be charged to the respective electric charge. The bit lines coupled to ferroelectric memory cells 100 stored with "0" may transmit a voltage lower than those coupled to ferroelectric memory cells 100 stored with "1." In some embodiments, the voltage for storing "0" is about tens or hundreds of milli-volts lower than the voltage for storing "1" in ferroelectric memory cell 100.

One or more of the m bit lines may include at least one twist segment. The number of bit lines having twist segment and the number of twist segments in a bit line, are not limited by the embodiments of the present disclosure. As shown in FIG. 1A, T1, T2, T3, and T4 each illustrates an range in which one or more twist segments are disposed, and S1, S2, S3, and S4 each illustrates an range in which no twist segment is disposed. The number of bit lines forming a twist segment can be an odd number or an even number. In some embodiments, two or more bit lines may form a bit line group, in which each of the two or more bit lines form a least one twist segment. The number of twist segments formed by a bit line group can be an odd number or an even number. In various embodiments, the m bit lines may include one or more bit line groups. In some embodiments, each of the bit line groups includes at least one twist segment. In some embodiments, at least one bit line on the edge of the m bit lines does not form a twist segment. Details of the arrangement of the bit lines are illustrated in FIGS. 2-6.

FIGS. 2-6 each illustrates exemplary arrangements of bit lines. For ease of illustration, ranges S1, S2, S3, S4, . . . etc., and T1, T2, T3, T4, etc. are employed to illustrate certain portions of the bit lines. The values (e.g., lengths) of S1, S2, S3, S4, . . . , and T1, T2, T3, T4, . . . , are each a positive value. In each of ranges S1, S2, S3, and S4, the bit lines do not include twist segments. For example, the bit lines extend only in the x-direction in these ranges. In each of ranges T1, T2, T3, and T4, the bit lines include a twist segment. For example, at least one bit line extends in a different direction than the x-direction in these ranges. For the convenience of description, segment Sn (n=1, 2, 3, 4, . . . ) refers to the segment of a bit line group in range Sn, portion Sn (n=1, 2, 3, 4, . . . ) refers to the portion of a bit line in range Sn, and twist segment Tn (n=1, 2, 3, 4, . . . ) refers to the twist segment of a bit line group in range Tn. In some embodiments, for ease of description, a segment Sn of a bit line group includes a portion Sn of each of the bit lines in the bit line group, and a twist segment Tn of a bit line group includes a portion Sn of each of the bit lines in the bit line group. The values of S1, S2, S3, and S4 can be the same or different from one another. The values of T1, T2, T3, and T4 can be the same or different from one another. In some embodiments, the values of ranges S1, S2, S3, and S4 are substantially the same. In some embodiments, the values of ranges T1, T2, T3, and T4 are substantially the same. In some embodiments, bit lines are not coupled to any ferroelectric memory cells in range Tn.

Figure 2:
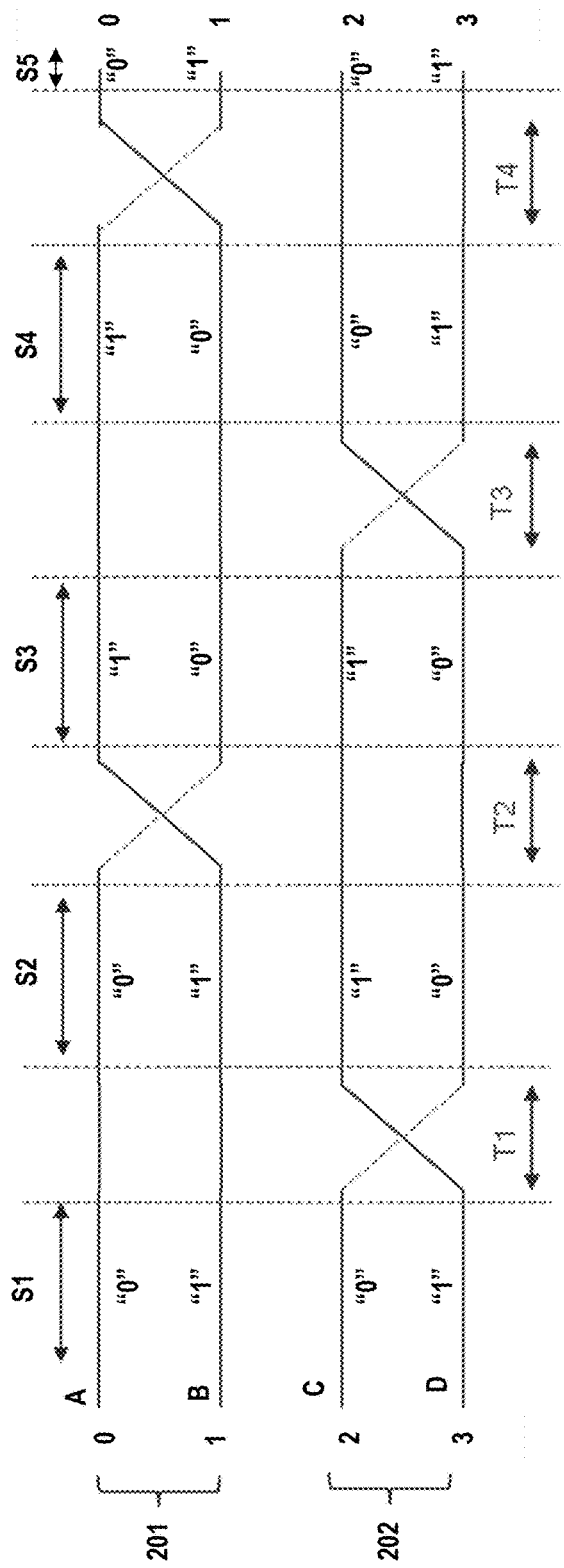
FIGS. 2, 3, 4, 5, and 6 each illustrates an exemplary arrangement of bit lines, according to some embodiments of the present disclosure.

FIG. 2 illustrates an exemplary arrangement 200 of bit lines, according to embodiments of the present disclosure. Bit lines 0, 1, 2, and 3 may be examples of four adjacent bit lines in the m bit lines in FIG. 1A, in which m being a positive integer equal to or greater than 4. Bit lines 0, 1, 2, and 3 may each extend in parallel in the x-direction, and may be separated from one another in the y-direction. Lines A, B, C, and D are four separate and parallel lines extending in the x-direction, and are employed to indicate the relative positions of bit lines 0, 1, 2, and 3 in the y-direction. In some embodiments, lines A, B, C, and D are evenly spaced in the y-direction. Bit lines 0, 1, 2, and 3 may be divided into two groups. Bit lines 0 and 1, adjacent to each other, may be in group 201. Bit lines 2 and 3, adjacent to each other, may be in group 202. Bit lines 0 and 2 are coupled to ferroelectric memory cells stored with data 0 ("0"), and bit lines 1 and 3 are coupled to ferroelectric memory cells stored with data 1 ("1"). The bit lines in each bit line group 201/202 are intertwined in the x-direction.

As shown in FIG. 2, bit line group 201 may include bit lines 0 and 1, each of which extends along both line A and line B. A distance between line A and line B in the y-direction is greater than zero. Bit line group 201 may include a first segment, a second segment, and a twist segment T2 in contact with and between the first and second segment. The first segment of bit line group 201 may include a segment S2, which include, a portion S2 of bit line 0 and a portion S2 of bit line 1 in range S2. In some embodiments, the first segment of bit line group 201 may also include portions of bit line 0 and bit line 1 in contact with the portions S2 of bit line 0 and bit line 1, in the x-direction further away from the circuit. For example, the first segment of bit line group 201 may include a segment S1 of bit line group 201, and any other portions of bit line group 201 between segments S2 and S1, such as a portion T1 of bit line 0 and a portion T1 of bit line 1. Segment S1 may include a portion S1 of bit line 0 and a portion S1 of bit line 1. In the first segment of bit line group 201, bit line 0 and bit line 1 each extends only in the x-direction such that distance between bit line 0 and bit line 1 in the y-direction maintains the distance between line A and line B.

The second segment of bit line group 201 may include a segment S3, which include, a portion S3 of bit line 0 and a portion S3 of bit line 1 in range S3. In some embodiments, the second segment of bit line group 201 may also include portions of bit line 0 and bit line 1 in contact with the portions S3 of bit line 0 and bit line 1, in the x-direction closer to the circuit. For example, the second segment of bit line group 201 may also include a segment S4 of bit line group 201 and any other portions of bit line group 201 between segments S4 and S3, such as a portion T3 of bit line 0 and a portion T3 of bit line 1. Segment S4 may include a portion S4 of bit line 0 and a portion S4 of bit line 1. In the second segment of bit line group 201, bit line 0 and bit line 1 each extends only in the x-direction such that distance between bit line 0 and bit line 1 in they-direction maintains the distance between line A and line B.

Twist segment T2 of bit line group 201 includes a portion T2 of bit line 0 and a portion T2 of bit line 1. Portion T2 of bit line 0, shown as a dashed line, extends in a first direction different from the x-direction and the y-direction, and is in contact with the portions S2 and S3 of bit line 0. Because the ferroelectric memory cells coupled to the same bit line are stored with the same memory data, the order of data transmitted in the bit line group may change (e.g., flip) after passing a twist segment, as shown in FIG. 2. For a bit line group of two bit lines transmitting "0" and "1," an odd number of twist segment(s) may cause the order of data received by the circuit to change (e.g., flip), and an even number of twist segments may not change the order of data received by the circuit. For ease of illustration, bit lines represented by a solid line are in a same first plane, and a bit line represented by a dashed line is in a second plane different than the first plane.

In twist segment T2, portion T2 of bit line 1, shown as a solid line, extends in a second direction different from the x-direction, the y-direction, the first direction, and is in contact with the portions S2 and S3 of bit line 1. On the lateral plane, i.e., the x-y plane, the orthogonal projections of the portions T2 of bit line 0 and bit line 1 may cross with each other. Portion T2 of bit line 0 and portion T2 of bit line 1 are insulated to each other. In some embodiments, portion T2 of bit line 0 and portion T2 of bit line 1 are on different planes (e.g., elevations) in the z-direction. For example, portions S1, S2, S3, S4, T1, T2, and T3 of bit line 1, and portions S1, S2, S3, S4, T1, T3, and T4 of bit line 0, may be on the same plane. Portion T2 of bit line 0 may be on a different plane, above or below portion T2 of bit line 1. Portion T2 of bit line 0 may be formed with the same material as the first and second segments of bit lines 0 and 1 or a different material than the first and second segments of bit lines 0 and 1. Portion T2 of bit line 1 may be formed with the same material as the first and second segments of bit lines 0 and 1. The structure and material of portions of bit lines in a twist segment may be described in FIGS. 7A and 7B.

In some embodiments, as shown in FIG. 2, bit line group 201 includes another twist segment T4 in contact with the second segment of bit line group 201, and a third segment in contact with twist segment T4. Twist segment T4 of bit line group 201 includes a portion T4 of bit line 0 and a portion T4 of bit line 1. The third segment of bit line group 201 may include portion S5 of bit line 0 and a portion S5 of bit line 1, between twist segment T4 and the circuit. Portion T4 of bit line 1, shown as a dashed line, extends in the first direction, and is in contact with portion S4 and S5 of bit line 1. Portion T4 of bit line 0, shown as a solid line, extends in the second direction different from the x-direction, the y-direction, the first direction, and is in contact with portion S4 and S5 of bit line 0. On the lateral plane, i.e., the x-y plane, the orthogonal projections of the portions T4 of bit line 0 and bit line 1 may cross with each other. In some embodiments, portion T4 of bit line 0 and portion T4 of bit line 1 are on different planes (e.g., elevations) in the z-direction. Portions T4 of bit line 0 and bit line 1 are insulated to each other and may be on different planes (e.g., elevations) in the z-direction. Twist segment T4 may be similar to twist segment T2, and the detailed description of twist segment T4 is not repeated herein.

As shown in FIG. 2, the portions S1, T1, S2, S5 of bit line 0, and portions S3, T3, S4 of bit line 1 may be positioned at line A; portion S1, T1, S2, S5 of bit line 1, and portion S3, T3, S4 of bit line 0 may be positioned at line B. Because when coupled to circuit, portions S5 of bit lines 0 and 1 are respectively positioned at the same lines as the portions S1 (and S2) of bit lines 0 and 1, the order of data transmitted to the circuit by bit line 0 and bit line 1 remains the same as that before being transmitted through the twist segments T2 and T4. For example, bit lines 0 and 1 transmits "01" before twist segments T2 and T4, and transmits "01" into circuit. In some embodiments, the order of data transmitted to the circuit by a bit line group remains unchanged at the circuit when a total number of twist segments in the bit line group is an even number.

Arrangement 200 may also include bit line group 202, which may include bit lines 2 and 3, each of which extends along both line C and line D. A distance between line C and line D in the y-direction is greater than zero. Bit line group 202 may include a first segment, a second segment, and a twist segment T1 in contact with and between the first and second segment. The first segment of bit line group 202 may include a segment S1, which include, a portion S1 of bit line 2 and a portion S1 of bit line 3 in range S1. In some embodiments, the first segment of bit line group 202 may also include portions of bit line 2 and bit line 3 in contact with portions S1 of bit line 2 and bit line 3, in the x-direction further away from the circuit. In the first segment of bit line group 201, bit line 2 and bit line 3 each extends only in the x-direction such that distance between bit line 2 and bit line 3 in the y-direction maintains the distance between line C and line D.

The second segment of bit line group 202 may include a segment S2, which includes, a portion S2 of bit line 2 and a portion S2 of bit line 3 in range S2. In some embodiments, the second segment of bit line group 202 may also include portions of bit line 2 and bit line 3 in contact with the portions S2 of bit line 2 and bit line 3, in the x-direction closer to the circuit. For example, the second segment of bit line group 202 may include bit line group 202 in a segment S3 and any other portions of bit line group 202 between segment S2 and S3, such as a segment T2. Segment S3 may include a portion S3 of bit line 2 and a portion S3 of bit line 3, and Segment T2 may include a portion T2 of bit line 2 and a portion T2 of bit line 3. In the second segment of bit line group 202, bit line 2 and bit line 3 each extends only in the x-direction such that distance between bit line 2 and bit line 3 in the y-direction maintains the distance between line C and line D.

Twist segment T1 of bit line group 202 includes a portion T1 of bit line 2 and a portion T1 of bit line 3. Portion T1 of bit line 2, shown as a dashed line, extends in the first direction, and is in contact with portions S1 and S2 of bit line 2. Portion T1 of bit line 3, shown as a solid line, extends in the second direction, and is in contact with portions S1 and S2 of bit line 3. On the lateral plane, i.e., the x-y plane, the orthogonal projections of the portions T1 of bit line 2 and bit line 3 may cross with each other. Similar to twist segment T2 and T4, portions T1 of bit line 2 and bit line 3 are insulated to each other. The detailed description of twist segment T1 may be referred to that of twist segment T2 and FIGS. 7A and 7B.

In some embodiments, as shown in FIG. 2, bit line group 202 includes another twist segment T3 in contact with the second segment of bit line group 202, and a third segment in contact with twist segment T3. Twist segment T3 of bit line group 202 includes a portion T3 of bit line 2 and a portion T3 of bit line 3. The third segment of bit line group 202 may include a segment S4, which includes a portion S4 of bit line 2 and a portion S4 of bit line 3, parallel to each other and extending in in range S4. In some embodiments, the third segment of bit line group 202 may also include portions of bit line 2 and bit line 3 in contact with the portions S4 of bit line 2 and bit line 3, in the x-direction closer to the circuit. For example, the third segment of bit line group 202 may include any other portions of bit line group 202 between twist segment T3 and circuit, such as portions T4 and portions S5 of bit line 2 and bit line 3. In the third segment of bit line group 202, bit line 2 and bit line 3 each extends only in the x-direction such that distance between bit line 2 and bit line 3 in they-direction maintains the distance between line C and line D. Portion T3 of bit line 3, shown as a dashed line, extends in the first direction and is in contact with the portions S3 and S4 of bit line 3. Portion T3 of bit line 2, shown as a solid line, extends in the second direction and is in contact with the portions S3 and S4 of bit line 2. Twist segment T3 may be similar to twist segment T1, T2, and T4, and the detailed description of twist segment T3 is not repeated herein. Similar to bit line group 201, a total number of twist segments in bit line group 202 is an even number, and the order of data transmitted to the circuit by a bit line group remains unchanged at the circuit.

In some embodiments, as shown in FIG. 2, twist segments T1, T2, T3, and T4 are staggered with one another in the x-direction. In other words, the orthogonal projections of twist segments T1, T2, T3, and T4 are separated with one another in the x-direction. In some embodiments, the distance, in the x-direction, between adjacent twist segments (e.g., T1 and T2, T2, and T3, T3 and T4) are substantially the same.

Figure 3:
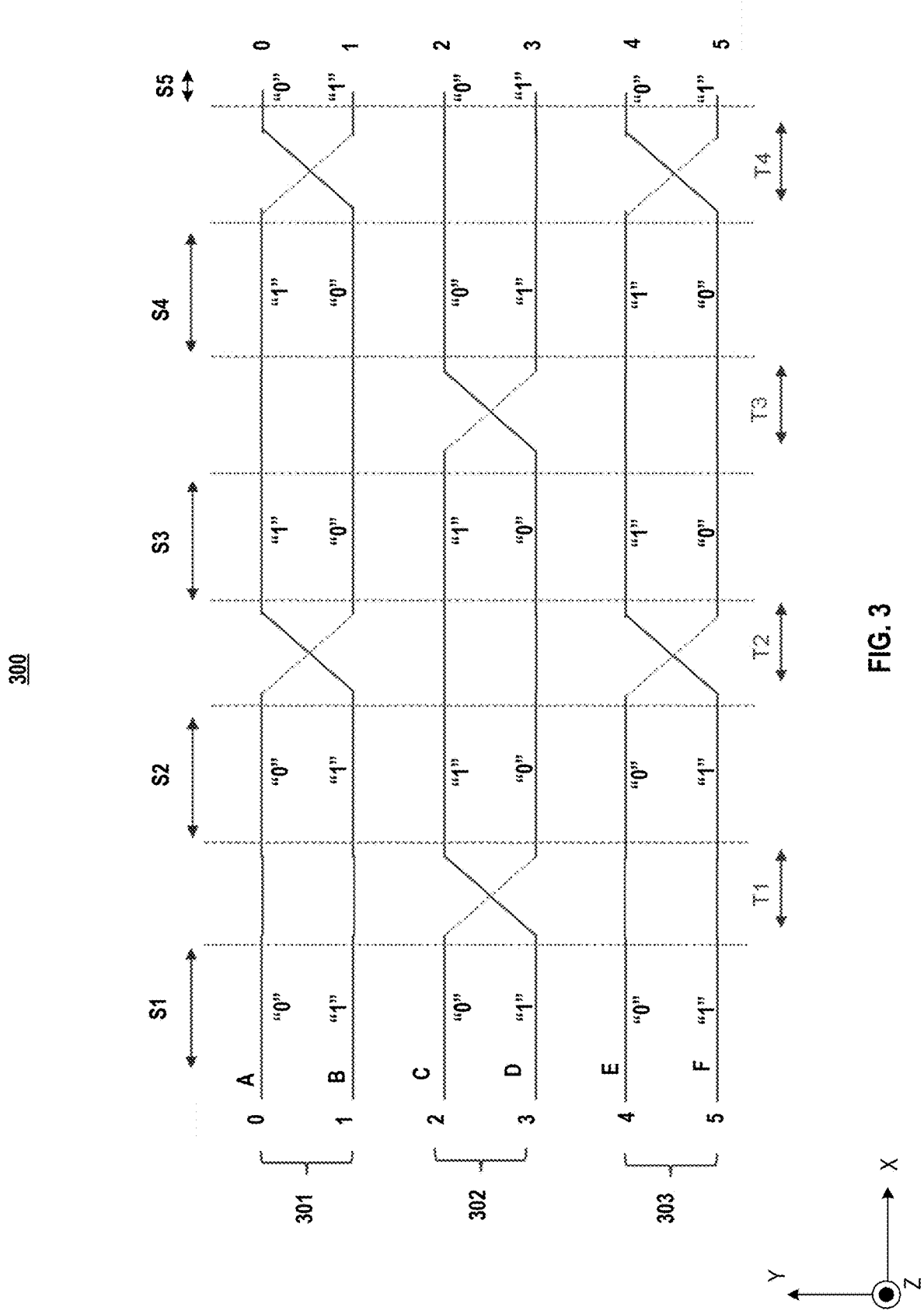

FIG. 3 illustrates another exemplary arrangement 300 of bit lines, according to embodiments of the present disclosure. Arrangement 300 may include a bit line group 301 and a bit line group 302, respectively similar to bit line groups 201 and 202. Different from arrangement 200, arrangement 300 may include an additional bit line group 303, similar to bit line group 302 (e.g., 201). Bit line group 303 may include a bit line 4 and a bit line 5, extending in line E and line F. Bit line group 303 may include a first segment, a second segment, a twist segment T2 in contact with the first segment and the second segment. Bit line group 303 may also include a twist segment T4, and other portions of bit lines 4 and 5 between twist segment T4 and circuit. Similar to bit line group 301, a total number of twist segments in bit line group 303 is an even number, and the order of data transmitted to the circuit by bit line group 303 remains unchanged at the circuit. The detailed description of each segment of bit line group 303 may referend to that of bit line group 201, and is not repeated herein. As shown in FIG. 3, bit line group 303 may also include two twist segments separated in the x-direction. In an example, as shown in FIG. 3, bit line group 303 may include twist segments T2 and T4, aligned with twist segments T2 and T4 of bit line group 301. In another example, although not shown, bit line group 303 may include two twist segments that are staggered with each of twist segments T1, T2, T3, and T4, in the x-direction. That is, the twist segments of all bit line groups (e.g., 301, 302, and 303) are separated from one another in the x-direction.

In various embodiments, pattern 300 may include one or more bit line groups aligned in the y-direction. The number of bit line groups may be odd or even. In some embodiments, the twist segments of all bit line groups are separated from one another in the x-direction, such that the orthogonal projections of all twist segments in pattern 300 in the x-direction do not overlap. In some embodiments, the distance between adjacent twist segments is the same. In some embodiments, the arrangement of bit line groups 301 and 302 repeat in the x-direction for at least twice. For example, in some embodiments, the twist segments in the odd-number bit line groups (e.g., 301, 303) are aligned in the y-direction, and twist segments in the even-number bit line groups (e.g., 302, 304 (if any)) are aligned in they-direction.

Figure 4:
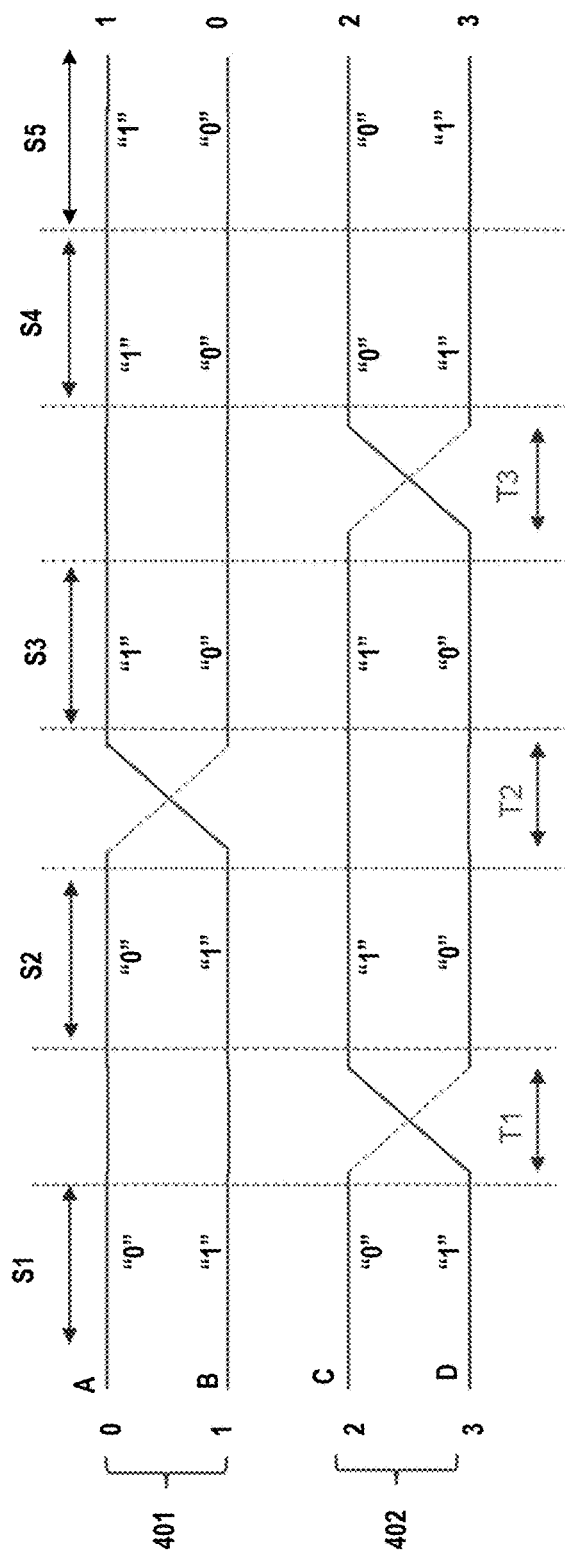

FIG. 4 illustrates another exemplary arrangement 400 of bit lines, according to embodiments of the present disclosure. Arrangement 400 may include a bit line group 401 and a bit line group 402. Bit line group 401 may include a bit line 0 and a bit line 1, extending in the A line and B line. Bit line group 402 may include a bit line 2 and a bit line 3, extending in the C line and D line. Different from arrangements 200 and 300, bit line groups (e.g., 401, 402) of arrangement 400 includes different numbers of twist segments. In some embodiments, bit line group 401 include an odd number of twist segment(s), and bit line group 402 includes an even number of twist segments. As an example, as shown in FIG. 4, bit line group 401 includes one twist segment T2, and bit line group 402 includes two twist segments T1 and T3. Bit line group 402 may include a first segment, a second segment, twist segment T1, twist segment T3, and a third segment between twist segment T3 and circuit. T1 may be in contact with the first segment and the second segment, and twist segment T3 may be in contact with the second segment and the third segment. Similar to bit line group 202, the total number of twist segments in bit line group 402 is even, and the order of data transmitted to the circuit by a bit line group remains unchanged at the circuit. The detailed description of each segment of bit line group 402 may referend to that of bit line group 202, and is not repeated herein.

Bit line group 401 may include a first segment, a second segment, and twist segment T2 in contact with the first segment and the second segment. The first segment may include segment S1, segment S2, and any portion of bit line group 401 between segment S1 and segment S2. The second segment may include segment S3, segment S4, any portion of bit line group 401 between segment S3 and segment S4, and any portion of bit line group 401 between segment S4 and circuit (e.g., segment S5). The first segment of bit line group 401 may include segment S2, which include, a portion S2 of bit line 0 and a portion S2 of bit line 1 in range S2. The first segment of bit line group 401 may also include portions S1 of bit lines 0 and 1 in range S1 and portions Ti of bit lines 0 and 1 in range T1. The second segment of bit line group 401 may include segment S3, which include, a portion S3 of bit line 0 and a portion S3 of bit line 1 in range S3. The second segment of bit line group 401 may also include portions S4 of bit lines 0 and 1 in range S4 and portions T3 of bit lines 0 and 1, portions S5 of bit lines 0 and 1 between segment S4 and circuit. Twist segment T2 may include a portion T2 of bit line 0 and a portion T2 of bit line 1, crossing each other on a lateral plane (e.g., the x-y plane). In the first and second segments of bit line group 401, bit line 0 and bit line 1 each extends only in the x-direction such that distance between bit line 0 and bit line 1 in they-direction maintains the distance between line A and line B. Twist segment T2 of bit line group 401 may be similar to twist segment T2 of bit line 201 and the detailed description is not repeated herein. In some embodiments, in the x-direction, the orthogonal projections of twist segments T1, T2, and T3 are separated to one another.

As shown in FIG. 4, because the total number of twist segments in bit line group 401 is an even number, e.g., 1, the order of data transmitted to the circuit by bit line group 401 has unchanged, e.g., flipped from the first segment to the second segment. Accordingly, because the order of data remains the same in the second segment, the order of data received by the circuit has also changed compared to that of the first segment. In some embodiments, the transistors, in the circuit for respectively receiving bit lines 0 and 1, may be adjusted to accommodate the change of order of data. For example, as shown in FIG. 4, the order of data in bit line groups 401 and 402, prior to the twist segments (e.g., T1, T2, and T3), is "0101," and is "1001" after passing the twist segments.

Figure 5:
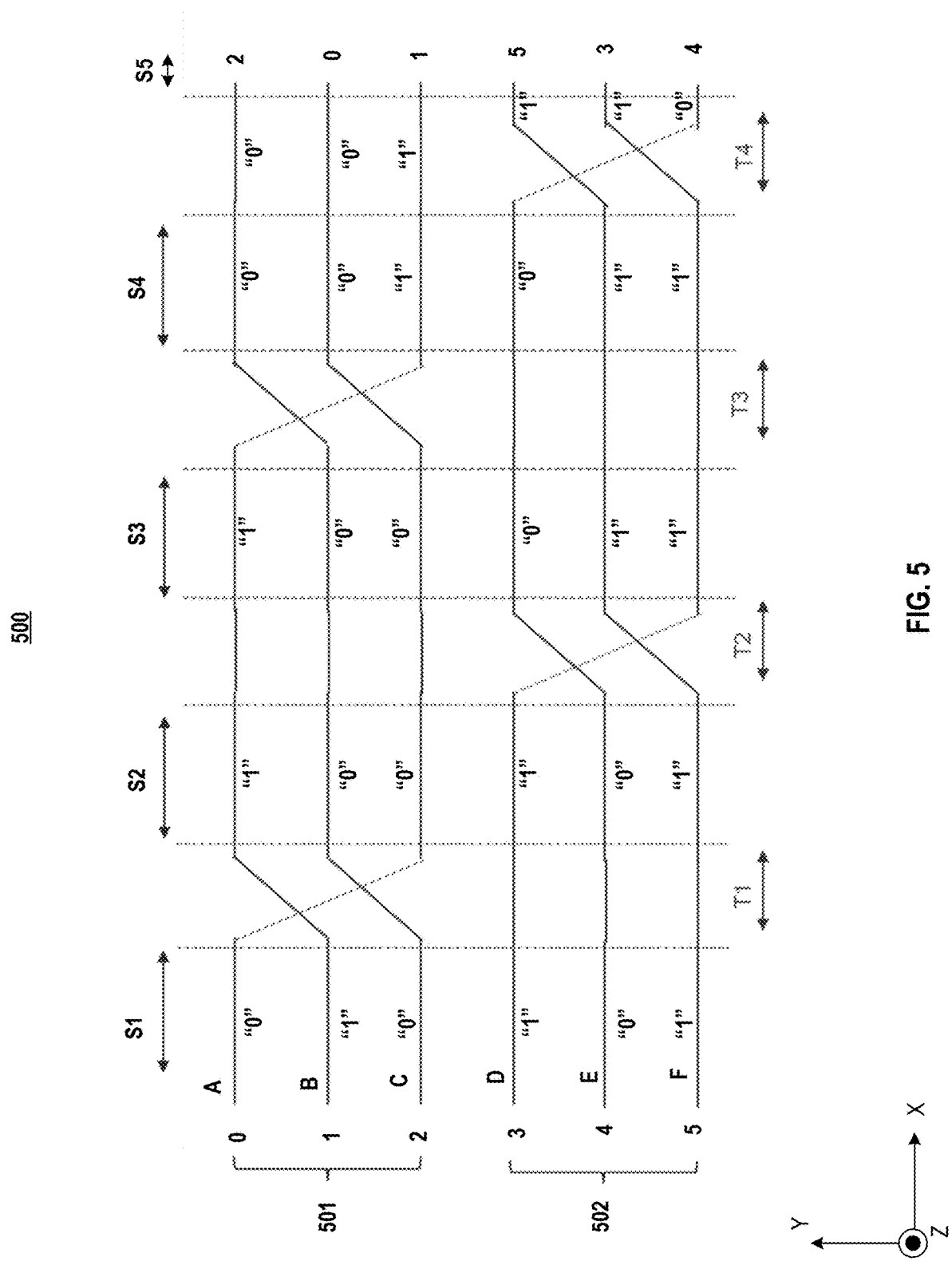

FIG. 5 illustrates another exemplary arrangement 500 of bit lines, according to embodiments of the present disclosure. Arrangement 500 may include a bit line group 501 and a bit line group 502. Different from arrangements 200, 300, and 400, at least one of bit line groups 501 and 502 of arrangement 500 may include more than two bit lines. In some embodiments, bit line groups 501 and 502 each includes more than two bit lines. As an example, as shown FIG. 5, bit line groups 501 and 502 may each include three bit lines. As shown in FIG. 5, bit line 0, bit line 1, and bit line 2 of bit line group 501 may be stored with, respectively, 0, 1, 0; and bit lines 3, 4, and 5 may be stored with, respectively, 0, 1, 0. Bit line 0, bit line 1, and bit line 2 may extend along line A, line B, and line C. Bit line 3, bit line 4, and bit line 5 may extend along line D, line E, and line F.

Bit line group 501 may include a first segment, a second segment, and a twist segment T1 in contact with and between the first and second segment. The first segment of bit line group 501 may include a segment S1, which include, a portion S1 of bit line 0, a portion S1 of bit line 1, and a portion S1 of bit line 2 in range S1. In some embodiments, the first segment of bit line group 501 may also include portions of bit line 0, bit line 1, and bit line 2 in contact with the portions S1 of bit line 0, bit line 1, and bit line 2, in the x-direction further away from the circuit. In the first segment of bit line group 501, bit line 0, bit line 1, and bit line 2 each extends only in the x-direction such that, in the y-direction, the distance between bit line 0 and bit line 1 maintains the distance between line A and line B, and the distance between bit line 1 and bit line 2 maintains the distance between line B and line C.

The second segment of bit line group 201 may include a segment S2, which include, a portion S2 of bit line 0, a portion S2 of bit line 1, and a portion S2 of bit line 2 in range S2. In some embodiments, the second segment of bit line group 201 may also include a segment S3 coupled to segment S2, and a segment T2 between and in contact with segments S2 and S3. Segment S3 of bit line group 501 may include portions S3 of bit line 0, bit line 1, and bit line 2 in segment S3. Segment T2 of bit line group 501 may include portions T2 of bit line 0, bit line 1, and bit line in range T2. In the second segment of bit line group 501, bit line 0, bit line 1, and bit line 2 each extends only in the x-direction such that in the y-direction, the distance between bit line 0 and bit line 1 maintains the distance between line A and line C, and the distance between bit line 1 and bit line 2 maintains the distance between line A and line B.

Twist segment T1 of bit line group 501 includes a portion T1 of bit line 0, a portion T1 of bit line 1, and a portion T1 of bit line 2. Portion T1 of bit line 0, shown as a dashed line, extends in a first direction different from the x-direction and the y-direction, and is in contact with the portions S1 and S2 of bit line 0. Portions T1 of bit line 1 and bit line 2, each shown as a solid line, extends in a second direction different from the x-direction, the y-direction, the first direction, and is in contact with portions S1 and S2 of respectively bit line 1 and bit line 2. On the lateral plane, i.e., the x-y plane, the orthogonal projections of the portions T1 of bit line 0, bit line 1, and bit line 2 may cross with each other. Portions T1 of bit line 0, portion T1 of bit line 1, and portion T1 of bit line 2 are insulated to one another. In some embodiments, in the z-direction, the portion T1 of bit line 0 is on a different plane than portions T1 of bit line 1 and bit line 2. For example, portions S1, T1, S2 of bit line 1 and bit line 2, and portions S1 and S2 of bit line 0 may be on the same plane. Portion T1 of bit line 0 may be on a different plane, above or below portions T1 of bit line 1 and bit line 2. The material and location of portion T1 may be similar to those of portion T2 of bit line group 201, and the detailed description is not repeated herein.

In some embodiments, as shown in FIG. 5, bit line group 501 includes another twist segment T3 coupled to the second segment of bit line group 501, and a third segment coupled to twist segment T3. Twist segment T3 of bit line group 501 includes a portion T3 of bit line 0, a portion T3 of bit line 1, and a portion T3 of bit line 2. The detailed description of twist segment T3 may be referred to that of twist segment T1 of bit line group 501, and is not repeated herein. The third segment of bit line group 501 may include a segment S4, which includes a portion S4 of bit line 0, a portion S4 of bit line 1, and a portion S4 of bit line 2, parallel to each other and extending in in range S4. In some embodiments, the third segment of bit line group 501 may also include portions of bit line 0, bit line 1, and bit line 2 in contact with the portions S4 of bit line 0, bit line 1, and bit line 2, in the x-direction closer to the circuit. For example, the third segment of bit line group 501 may include portions of bit line group 501 between twist segment T3 and circuit, in range T4 and range S5, which each includes respective portions of bit line 0, bit line 1, and bit line 2. In the third segment of bit line group 501, bit line 0, bit line 1, and bit line 2 each extends only in the x-direction such that, in the y-direction, the distance between bit line 0 and bit line 1 maintains the distance between line B and line C, and the distance between bit line 1 and bit line 2 maintains the distance between line A and line C.

Arrangement 500 may also include bit line group 502 adjacent to bit line group 502. Bit line group 502 may include a first segment, a second segment, and a twist segment T2 in contact with and between the first and second segment. The first segment of bit line group 502 may include a segment S2, which include, a portion S2 of bit line 3, a portion S2 of bit line 4, and a portion S2 of bit line 5 in range S2. In some embodiments, the first segment of bit line group 502 may also include a segment S1 coupled to segment S2 in the x-direction further away from the circuit. The first segment of bit line group 502 may also include portions S1 of bit line 3, bit line 4, and bit line 5 in range S1, and portions T1 of bit line 3, bit line 4, and bit line 5 between range S2 and S1 (e.g., in range T1). In the first segment of bit line group 502, bit line 3, bit line 4, and bit line 5 each extends only in the x-direction such that, in the y-direction, the distance between bit line 3 and bit line 4 maintains the distance between line D and line E, and the distance between bit line 4 and bit line 5 maintains the distance between line E and line F.

The second segment of bit line group 201 may include a segment S3, which include, a portion S3 of bit line 3, a portion S3 of bit line 4, and a portion S3 of bit line 4 in range S3. In some embodiments, the second segment of bit line group 502 may also include a segment S4 coupled to segment S3. The second segment of bit line group 502 may include portions S4 of bit line 3, bit line 4, and bit line 5 in segment S4, as well as portions T3 of bit line 3, bit line 4, and bit line 5 in range T3. In the second segment of bit line group 502, bit line 3, bit line 4, and bit line 5 each extends only in the x-direction such that in the y-direction, the distance between bit line 3 and bit line 4 maintains the distance between line D and line F, and the distance between bit line 4 and bit line 5 maintains the distance between line D and line E.

Twist segment T2 of bit line group 502 includes a portion T2 of bit line 3, a portion T2 of bit line 4, and a portion T2 of bit line 5. Portion T2 of bit line 3, shown as a dashed line, extends in the first direction, and is in contact with portions S2 and S3 of bit line 3. Portions T2 of bit line 4 and bit line 5, each shown as a solid line, extends in the second direction, and is in contact with portions S2 and S3 of respectively bit line 4 and bit line 5. The detailed description of twist segment T2 may be referred to that of twist segment T1 of bit line group 501, and is not repeated herein.

In some embodiments, as shown in FIG. 5, bit line group 501 includes another twist segment T4 coupled to the second segment of bit line group 502, and a third segment coupled to twist segment T4. Twist segment T4 of bit line group 502 includes a portion T4 of bit line 3, a portion T4 of bit line 4, and a portion T4 of bit line 5. The detailed description of twist segment T4 may be referred to that of twist segment T1 of bit line group 501, and is not repeated herein. The third segment of bit line group 502 may include portions S5 of bit line 3, bit line 4, and bit line 5 respectively in contact with portions T4 of bit line 3, bit line 4, and bit line 5. In the third segment of bit line group 502, bit line 3, bit line 4, and bit line 5 each extends only in the x-direction such that, in they-direction, the distance between bit line 3 and bit line 4 maintains the distance between line E and line F, and the distance between bit line 4 and bit line 5 maintains the distance between line D and line F.

As shown in FIG. 5, in a twist segment (e.g., T1, T2, T3, T4) in bit line groups 501 and 502, at least a portion of one bit line crosses with each of the rest of the bit lines, in a lateral plane. In some embodiments, to minimize the complexity of fabrication, only one bit line in a bit line group crosses with the rest of the bit lines, such that the rest of the bit lines can be formed on a same lateral plane, and only one bit line needs to be formed, partially, on a different lateral plane. For example, in a twist segment, one bit line may extend in the first direction different direction than the x-direction, and the rest of the bit lines may be parallel to one another in the second direction. The order of data to the circuit by bit line group 501/502 has changed, compared to the order of data transmitted in the first segment. In some embodiments, the transistors, in the circuit, for respectively receiving bit lines 0-5 may be adjusted to accommodate the change of order of data. For example, as shown in FIG. 5, the order of data in bit line groups 501 and 502, prior to the twist segments (e.g., T1, T2, T3, and T4), is "010101," and is "001110" after passing the twist segments.

Figure 6:
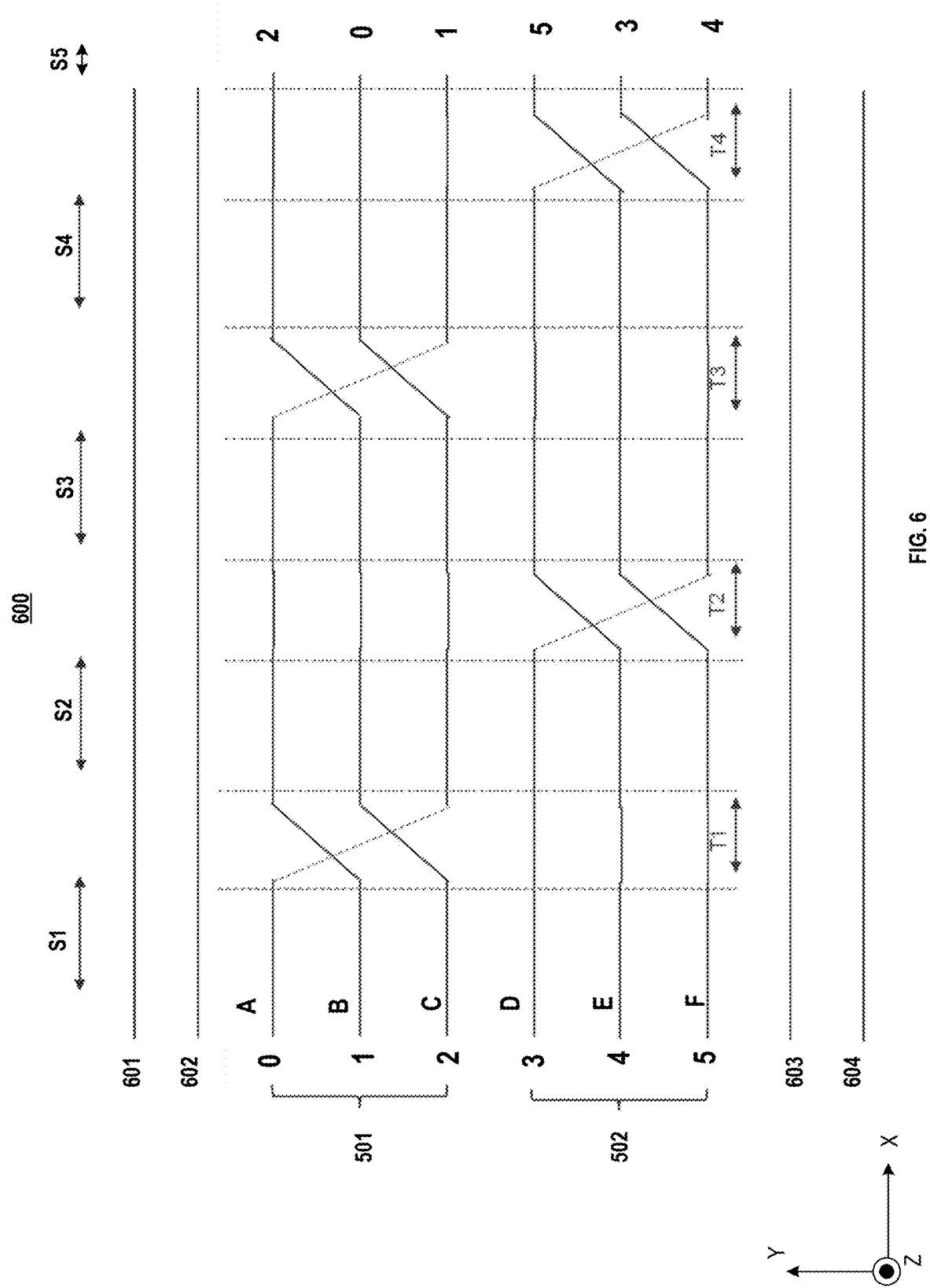

FIG. 6 illustrates an exemplary arrangement 600 in which one or more dummy bit lines e.g., 601, 602, 603, and 604, are formed on at least one side of the functional bit lines, according to some embodiments. As examples, bit lines in bit line groups 501 and 502 are depicted as examples of functional bit lines. Other bit line groups disclosed in the present disclosure may also be examples of the functional bit lines. In various embodiments, the number of bit line groups may be at least two. The dummy bit lines may include the same material(s) as the functional bit lines, and may not be coupled to any functional ferroelectric memory cells. The arrangement of dummy bit lines may cause the positions of the functional bit lines to be at/close to the center of the bit line pattern, reducing or eliminating the loading effect on the functional bit lines, during the fabrication. The functional bit lines can be formed with improved uniformity. In some embodiments, at least one dummy bit line is formed on each side of the functional bit lines. In some embodiments, the dummy bit lines are formed in the same fabrication process that forms the functional bit lines. For examples, the dummy bit lines may be formed in the same patterning process that forms the portions S1, S2, S3, S4, S5, etc.

The dummy bit lines, e.g., 601, 602, 603, and 604, may extend in parallel in the x-direction. In some embodiments, no twist segment is formed in any dummy bit lines. The distances, in they-direction, between adjacent dummy bit lines and between a dummy bit line and a functional bit line, may each be non-zero. In some embodiments, at least two dummy bit lines are formed on each side of the functional bit lines, on the edge of the bit line pattern. For example, referring back to FIG. 1A, dummy bit lines 601, 602, 603, and 604 may respectively represent an example of (dummy) bit lines 0, 1, (m−1), and m. It should be noted that, the specific number of dummy bit lines, e.g., on either side of the functional bit lines, should not be limited by the embodiments of the present disclosure.

Figure 7A:
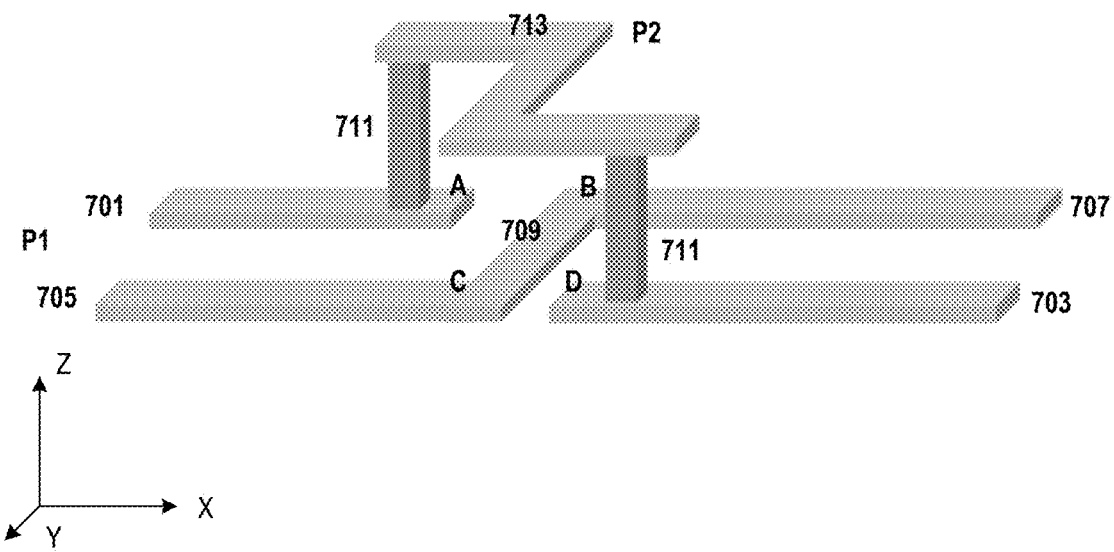
FIGS. 7A and 7B each illustrates a twist segment in the bit lines, according to the embodiments of the present disclosure.
Figure 7B:
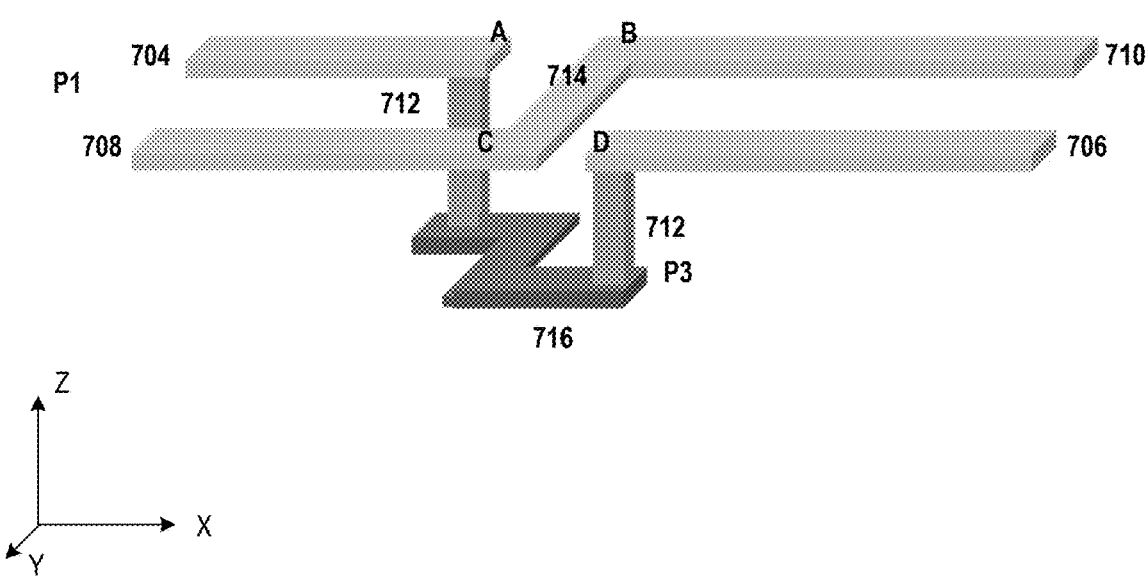

FIGS. 7A and 7B each illustrates an exemplary detailed structure (i.e., 700 and 702) of a twist segment, according to some embodiments. In a twist segment, the bit lines, in the same bit line group and initially extending in parallel, change the directions in which they extend. As shown in FIGS. 7A and 7B, in a twist segment, the two bit lines are disposed in different planes. A portion of one of the bit lines may be disposed on a different plane than the rest of the bit line group (e.g., the rest of the bit lines in the same bit line group and the rest portions of the same bit line). It should be noted that, FIGS. 7A and 7B each only shows two bit lines for illustrating the relative positions of the bit lines in a twist segment. In various embodiments, although not shown, a bit line group may include more than two bit lines, and all the bit lines except for the one with portion on a different plane, may be disposed on the same plane. Structures 700 and 702 or similar may be employed in all twist segments of the present disclosure. In some embodiments, the portion of a bit line that is on a different plane than the rest of the bit line group is depicted as the dashed lines in the twist segments shown in FIGS. 2-6.

FIG. 7A illustrates structure 700 showing an exemplary twist segment, as well as other segments in contact with the twist segment, in a bit line group. As an example, structure 700 includes a first bit line and a second bit line in a bit line group. The first bit line may include a portion 701, a portion 703, and a portion 713 in contact with portions 701 and 703. The second bit line may include a portion 705, a portion 707, and a portion 709 in contact with portions 705 and 707. Portions 701, 703, 705, and 707 may each extend in the x-direction. Portions 701 and 707 may be aligned with each other in the y-direction, and portions 705 and 703 may be aligned with each other in the y-direction. Portion 709 may be in contact with (e.g., in direct contact with) portions 705 and 707, and may extend in a direction different from the x-direction and the y-direction. For example, portion 709 may in contact with an end C of portion 705, and an end B of portion 707. In some embodiments, portions 701, 703, 705, 707, and 709 are disposed on a first plane P1 (e.g., a plane parallel to the x-y plane). In some embodiments, first plane P1 is referred to as a first metal layer. Other structures/devices, e.g., dummy bit lines, although not shown, may also be disposed on first plane P1.

Portion 713 of the first bit line may be disposed on a second plane P2 (e.g., a plane parallel to the x-y plane) different from first plane P1. In some embodiments, second plane P2 may be above first plane P1, and may be referred to as a second metal layer. For example, second plane P2 may be further away from a substrate (e.g., 108) that first plane P1. In another embodiment, although not shown, second plane P2 may be below first plane P1, e.g., being closer to the substrate than first plane P1. In some embodiments, although not shown, one or more insulating layers may be disposed between first plane P1 and second plane P2. The insulating layers, including an insulating material such as silicon oxide, may provide insulation amongst the bit lines and the vias. Portion 713 may be conductively connected to portions 701 and 703 through vias 711, as shown in FIG. 7A. One end of portion 713 may be conductively connected to an end A of portion 701 through via 711, and another end of portion 713 may be conductively connected to an end D of portion 703 through via 711. Portions 701 and 703 may be separated from each other and isolated from portion 709 of the second bit line. For the first bit line, portions 701 and 703 may be conductively connected to each other through portion 713 and vias 711.

A twist segment of structure 700 may include portions 709 and 713. Portions 709 and 713 may be insulated from each other, e.g., by one or more insulating layers (not shown) in between. In the x-y plane, orthogonal projections of portions 709 and 703 may overlap, e.g., cross, with each other. In some embodiments, the twist segment also include vias 711 in contact with portion 713 and the rest of the first bit line. Portion 713 may extend in any suitable direction(s) and is in contact with each via 711. For example, portion 713 may include a part (e.g., a middle part) that extends in a different direction from the x-direction, the y-direction, and the direction of portion 709. The specific direction(s) in which portion 713 extends should be determined based on the design and fabrication of the ferroelectric memory device, and should not be limited by the embodiments of the present disclosure.

Vias 711 may include any suitable conductive material such as tungsten, cobalt, aluminum, copper, silicides, polysilicon, or any combination of them. Portions 701, 703, 705, 707, and 709 of bit lines 701 and 705 may include the same material, and may be formed in a same fabrication process. In some embodiments, dummy bit lines include the same material as portions 701, 703, 705, 707, and 709 of bit lines 701 and 705. For example, portions 701, 703, 705, 707, and 709 may include any suitable conductive material such as tungsten, cobalt, aluminum, copper, silicides, polysilicon, or any combination of them. Portion 713 may include the same conductive material as the other portions (e.g., 701, 703, 705, 707, and 709), or may include a different conductive material. In some embodiments, portion 713 includes the same conductive material as the other portions.

FIG. 7B illustrates structure 702 showing another exemplary twist segment, as well as other segments in contact with the twist segment, in a bit line group. As an example, structure 702 includes a first bit line and a second bit line in a bit line group. The first bit line may include a portion 704, a portion 706, and a portion 716 in contact with portions 704 and 706. The second bit line may include a portion 708, a portion 710, and a portion 714 in contact with portions 708 and 710. Portions 704, 706, 708, and 710 may each extend in the x-direction. Portions 704 and 710 may be aligned with each other in the y-direction, and portions 708 and 706 may be aligned with each other in the y-direction. Of the second bit line, portion 714 may be in contact with (e.g., in direct contact with) portions 708 and 710, and may extend in a direction different from the x-direction and the y-direction. For example, portion 714 may in contact with an end C of portion 708, and an end B of portion 710. In some embodiments, portions 704, 706, 708, 710, and 714 are disposed on a first plane P1 (e.g., a plane parallel to the x-y plane). In some embodiments, first plane P1 is referred to as a first metal layer.

Portion 716 of the first bit line may be disposed on a third plane P3 (e.g., a plane parallel to the x-y plane) different from first plane P1. In some embodiments, third plane P3 may be below first plane P1. For example, third plane P3 may be closer to a substrate (e.g., 108) than first plane P1 or may be in a substrate. In some embodiments, although not shown, one or more insulating layers may be disposed between first plane P1 and third plane P3. The insulating layers, including an insulating material such as silicon oxide, may provide insulation amongst the bit lines and the vias. Portion 716 may be conductively connected to portions 704 and 706 through vias 712, as shown in FIG. 7B. One end of portion 716 may be conductively connected to an end A of portion 704 through via 712, and another end of portion 716 may be conductively connected to an end D of portion 706 through via 712. Portions 704 and 706 may be separated from each other and isolated from portion 714 of the second bit line. For the first bit line, portions 704 and 706 may be conductively connected to each other through portion 716 and vias 712.

A twist segment of structure 702 may include portions 714 and 716. Portions 714 and 716 may be insulated from each other, e.g., by one or more insulating layers (not shown) in between. In the x-y plane, orthogonal projections of portions 714 and 716 may overlap, e.g., cross, with each other. In some embodiments, the twist segment also include vias 712 in contact with portion 716 and the rest of the first bit line. Portion 716 may extend in any suitable direction(s) and is in contact with each via 712. For example, portion 716 may include a part (e.g., a middle part) that extends in a different from the x-direction, the y-direction, and the direction of portion 714. The specific direction(s) in which portion 716 should be determined based on the design and fabrication of the ferroelectric memory device, and should not be limited by the embodiments of the present disclosure.

In some embodiments, portion 716 (or third plane P3) may be disposed in a conductive region in the substrate (e.g., 108) or on the substrate. For example, portion 716 may include a conductive layer that is formed from a doped region in the substrate. In various embodiments, the dopant concentration of the doped region (e.g., portion 716) may be sufficiently high to reach a desirable conductively. The dopants may be N-type or P-type. In some embodiments, portion 716 may include a highly-doped region in the substrate. In some embodiments, the dopants include phosphorus. In some embodiments, portion 716 may include a metal silicide layer formed in the substrate (e.g., 108) or on the substrate. In some embodiments, portion 716 includes a conductively layer that is disposed in the same plane/layer, e.g., third plane P3, as the gate conductor (e.g., 124) of a ferroelectric memory cell (e.g., 100). In some embodiments, portion 716 and the gate conductor of the ferroelectric memory cell may include the same conductive material, such as tungsten, cobalt, aluminum, copper, silicides, polysilicon, or any combination of them. In some embodiments, portion 716 mat be disposed in a metal layer below first metal layer P1.

Vias 712 may include any suitable conductive material such as tungsten, cobalt, aluminum, copper, silicides, polysilicon, or any combination of them. Portions 704, 706, 708, 710, and 714 may include the same material, and may be formed in a same fabrication process. For example, portions 704, 706, 708, 710, and 714 may include any suitable conductive material such as tungsten, cobalt, aluminum, copper, silicides, polysilicon, or any combination of them. Portion 716 may include the same conductive material as the other portions (e.g., 704, 706, 708, 710, and 714), or may include a different conductive material.

In various embodiments, when a bit line group includes more than two bit lines, except for the bit line that has the portion (e.g., 713, 716) on another plane, all the rest bit lines can be formed in the same plane (e.g., first plane P1). In some embodiments, the portion on another plane (e.g., 713, 716) may be over all the other portions of the respective twist segment. In some embodiments, the orthogonal projections of the portion on another plane (e.g., 713, 716) may cross with all the other portions of the respective twist segment, as referring back to FIGS. 5 and 6, and the description. In some embodiments, in a bit line group, only one bit line is fabricated to include portions on another plane.

Figure 8:
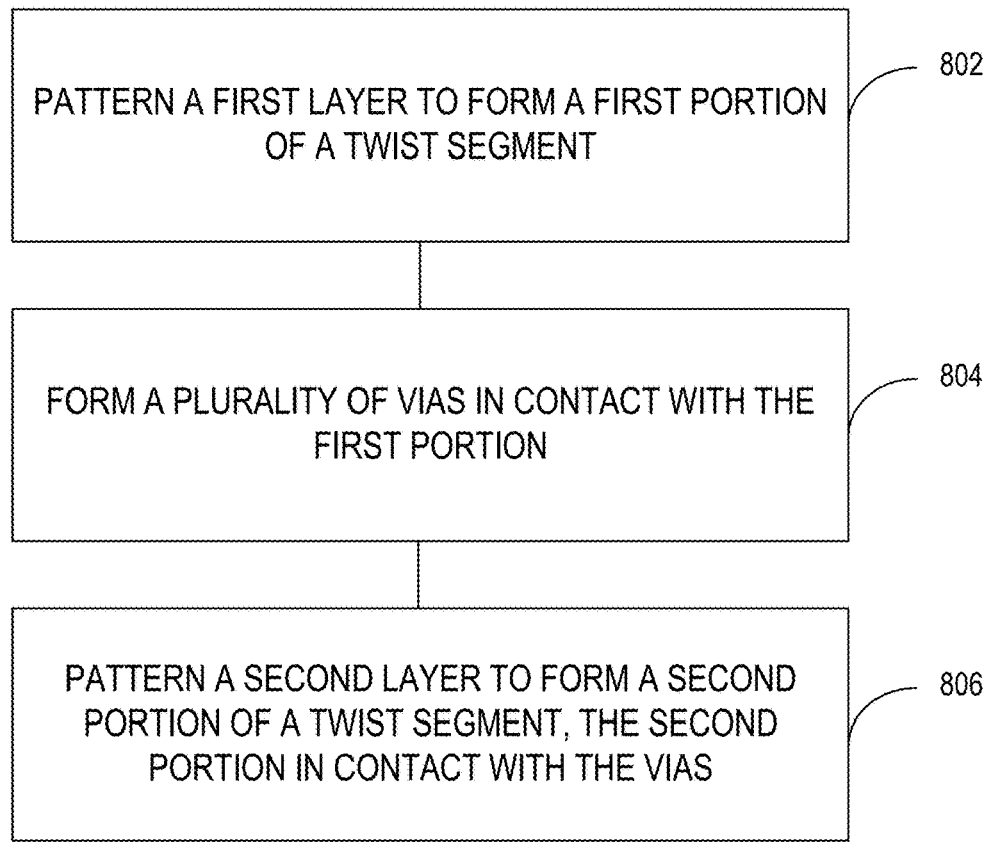
FIG. 8 is a flowchart of an exemplary method for forming bit lines with twist segments in a ferroelectric memory device, according to some embodiments of the present disclosure.

FIG. 8 illustrates method 800 for forming bit lines with twist segments in a ferroelectric memory device, according to some embodiments. For ease of illustration, FIGS. 7A, 7B, and 8 are described together. It should be understood that the operations shown in method 800 are not exhaustive and that other operations can be performed as well before, after, or between any of the illustrated operations. Further, some of the operations may be performed simultaneously, or in a different order than shown in the figures. In various embodiments, method 800 can include part or all of the operations in flowchart. In some embodiments, some operations of method 800 are not shown in the flowchart.

Referring to FIG. 8, method 800 starts at operation 802, in which a first layer is patterned to form a first portion of a twist segment. FIGS. 7A and 7B illustrate corresponding structures.

At the beginning of method 800, a first layer may be patterned to form a first portion of a twist segment. The patterning process may include photolithography and an etching process (e.g., wet and/or dry etch).

In some embodiments, to form structure 700 or similar, the first layer may include a layer deposited with a conductive material, such as metal. The first layer may be formed by a suitable deposition process such as chemical vapor deposition (CVD), physical vapor deposition (PVD), atomic layer deposition (ALD), or a combination of them. The first layer can be patterned to form a first portion (e.g., 709) of a twist segment. The first layer may also be patterned to form a plurality of other portions of bit lines (e.g., portions 701, 703, 705, 707), and dummy bit lines (e.g., 601, 602, 603, 604, if any).

In some embodiments, to form structure 702 or similar, the first layer may include a layer having a conductive material in or on a substrate of the ferroelectric memory device. In some embodiments, the first layer may include a doped region in the substrate, and can be formed by doping the substrate using a suitable implantation process such as ion implantation and/or in-situ doping. In some embodiments, the first layer may include a metal silicide layer in or on the substrate, and can be formed by any suitable process such as nitridation and/or deposition. In some embodiments, the first layer includes the same conductive layer used for forming the gate conductors of ferroelectric memory cells in the ferroelectric memory device. The first layer can be patterned to form a first portion (e.g., 716) of a twist segment. In some embodiments, the process to form the first portion, e.g., doping, patterning, and/or oxidation, of the first layer performed in the same processes that form other devices/structures of the first layer. The fabrication of the bit lines can thus be simplified.

Referring back to FIG. 8, method 800 proceeds to operation 804, in which a plurality of vias are formed. The vias are in contact with the first portion of the twist segment. FIGS. 7A and 7B illustrate corresponding structures.

A plurality of vias can be formed in contact with the first portion of the twist segment. In some embodiments, prior to forming the vias, one or more insulating layers may be formed over the first portion of the twist segment. The insulating layers may include any suitable insulating material such as silicon oxide, silicon nitride, and/or silicon oxynitride, and can be deposited using a suitable process such as CVD, PVD, and/or ALD. The insulating layers may be patterned to form a plurality of through holes that are in contact with the first portion of the twist segment. A conductive material may then be deposited to fill the through holes, forming the vias (711 for structure 700, 712 for structure 702). The formation of the vias may include photolithography, etching (dry etch and/or wet etch), CVD, PVD, ALD, and so on.

Referring back to FIG. 8, method 800 proceeds to operation 806, in which a second layer is patterned to form a second portion of the twist segment. The second portion of the twist segment may be in contact with the vias. FIGS. 7A and 7B illustrate corresponding structures.

The second layer may be a layer above the first layer, e.g., a layer further away from the substrate, compared to the first layer. In some embodiments, the second layer may be formed by depositing a conductive material, such as metal, over the insulating layers. The conductive material can be deposited by a suitable process such as CVD, PVD, ALD, or the like. The second layer may be in contact with the vias.

In some embodiments, to form structure 700 or similar, the second layer may be a second metal layer, or a metal layer above (e.g., immediately) the first layer. The second layer can be patterned to form a second portion (e.g., 713) of the twist segment. The patterning process may include photolithography and an etching process (e.g., wet and/or dry etch). In some embodiments, the process to form the second portion, e.g., deposition and/or patterning, of the first layer performed in the same processes that form other devices/structures of the first layer. The fabrication of the bit lines can thus be simplified.

In some embodiments, to form structure 702 or similar, the second layer can be patterned to form a second portion (e.g., 714) of the twist segment. The second layer may also be patterned to form a plurality of other portions of bit lines (e.g., portions 704, 706, 708, 710) and dummy bit lines (e.g., 601, 602, 603, 604, if any).

In various embodiments, although not shown, the first and second portions of a twist segment can each be formed in a same patterning process that forms the other signal lines in the same layer. For example, a first portion (e.g., 716) of a twist segment can be formed in a same patterning process that forms the gate conductors of the ferroelectric memory cells. In another example, a second portion (e.g., 713) of a twist segment can be formed in a same patterning that forms the other signal lines or devices in the second layer. The fabrication of the bit lines with twist segments can be simplified.

It should be noted that, although the present disclosure is exemplified using bit lines in a ferroelectric memory device, the method and arrangement provided by the present disclosure can also be employed in balancing the mismatch in voltage and/or structure caused by data pattern difference and fabrication process in other signal lines. The other signal lines may be any other suitable signal lines in a ferroelectric memory device or another electronic device.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising a bit line group comprising a first bit line and a second bit line, the bit line group comprising a first segment, a second segment, a twist segment conductively connected to the first segment of the bit line group and the second segment of the bit line group, and at least one dummy bit line extending in a first lateral direction, the at least one dummy bit line being adjacent to the bit line group in a fourth lateral direction perpendicular to the first lateral direction, wherein:

the first segment of the bit line group comprises a first portion of the first bit line and a first portion of the second bit line, the second segment of the bit line group comprises a second portion of the first bit line and a second portion of the second bit line, and the twist segment of the bit line group comprises a third portion of the first bit line and a third portion of the second bit line;

the first and second portions of the first bit line and the second bit line each extends in the first lateral direction; and the third portion of the first bit line is conductively connected to the first and second portions of the first bit line, and the third portion of the second bit line is conductively connected to the first and second portions of the second bit line, the third portion of the first bit line extending in a second lateral direction different from the first lateral direction, the third portion of the second bit line extending in a third lateral direction different from the first lateral direction and the second lateral direction.

2. The memory device of claim 1, further comprising a first plurality of memory cells coupled to the first bit line and a second plurality of memory cells coupled to the second bit line, wherein the first plurality of memory cells are each configured to store a "0," and the second plurality of memory cells are each configured to store a "1".

3. The memory device of claim 1, further comprising a second bit line group comprising a third bit line and a fourth bit line, the second bit line group comprising a first segment, a second segment, and a twist segment conductively connected to the first segment of the second bit line group and the second segment of the second bit line group, wherein:

the first segment of the second bit line group comprises a first portion of the third bit line and a first portion of the fourth bit line, the second segment of the second bit line group comprises a second portion of the third bit line and a second portion of the fourth bit line, and the twist segment of the second bit line group comprises a third portion of the third bit line and a third portion of the fourth bit line;

the first and second portions of the third bit line and the fourth bit line each extends in the first lateral direction;

the third portion of the third bit line is conductively connected to the first and second portions of the third bit line, and the third portion of the fourth bit line is conductively connected to the first and second portions of the fourth bit line, the third portion of the third bit line extending in the second lateral direction, the third portion of the fourth bit line extending in the third lateral direction; and the twist segment of the bit line group and the twist segment of the second bit line group are staggered in the first lateral direction.

4. The memory device of claim 3, wherein the bit line group and the second bit line group are adjacent to each other in the fourth lateral direction perpendicular to the first lateral direction.

5. The memory device of claim 3, wherein the bit line group further comprises a second twist segment coupled to the second segment of the bit line group, the second twist segment of the bit line group comprising a fourth portion of the first bit line and a fourth portion of the second bit line, and wherein:

the fourth portion of the first bit line is coupled to the second portion of the first bit line and extends in the third lateral direction, and the fourth portion of the second bit line is coupled to the second portion of the second bit line and extends in the second lateral direction; and the second twist segment of the bit line group and the twist segment of the second bit line group are staggered in the first lateral direction.

6. The memory device of claim 5, wherein the second bit line group further comprises a second twist segment coupled to the second segment of the second bit line group, the second twist segment of the second bit line group comprising a fourth portion of the third bit line and a fourth portion of the fourth bit line, and wherein:

the fourth portion of the third bit line is coupled to the second portion of the third bit line and extends in the third lateral direction, and the fourth portion of the fourth bit line is coupled to the second portion of the fourth bit line and extends in the second lateral direction; and the second twist segment of the second bit line group is staggered with each of the twist segment and the second twist segment of the bit line group in the first lateral direction.

7. The memory device of claim 6, further comprising a third bit line group comprising a fifth bit line and a sixth bit line, the third bit line group comprising a first segment, a second segment, and a twist segment conductively connected to the first segment of the third bit line group and the second segment of the third bit line group, wherein:

the first segment of the third bit line group comprises a first portion of the fifth bit line and a first portion of the sixth bit line, the second segment of the third bit line group comprises a second portion of the fifth bit line and a second portion of the sixth bit line, and the twist segment of the third bit line group comprises a third portion of the fifth bit line and a third portion of the sixth bit line;

the first and second portions of the fifth bit line and the sixth bit line each extends in the first lateral direction;

the third portion of the fifth bit line is conductively connected to the first and second portions of the fifth bit line, and the third portion of the sixth bit line is conductively connected to the first and second portions of the sixth bit line, the third portion of the fifth bit line extending in the second lateral direction, the third portion of the sixth bit line extending in the third lateral direction; and the twist segment of the third bit line group is staggered with each of the twist segment of the bit line group, the second twist segment of the bit line group, the twist segment of the second bit line group, and the second twist segment of the second bit line group in the first lateral direction.

8. The memory device of claim 7, wherein the bit line group further comprises a seventh bit line adjacent to at least one of the first bit line or the second bit line, the first segment of the bit line group comprising a first portion of the seventh bit line, the second segment of the bit line group comprising a second portion of the seventh bit line, and the twist segment of the bit line group comprising a third portion of the seventh bit line, wherein:

the first and second portions of the seventh bit line each extends in the first lateral direction; and the third portion of the seventh bit line is conductively connected to the first and second portions of the seventh bit line, the third portion of the seventh bit line extending in the third lateral direction.

9. The memory device of claim 1, wherein the at least one dummy bit line comprises a dummy bit line on both sides of the bit line group in the fourth lateral direction.

10. The memory device of claim 1, wherein the third portion of the first bit line and the third portion of the second bit line are insulated to each other, and are each at a respective elevation in a vertical direction perpendicular to the first lateral direction.

11. A memory device, comprising a first signal line and a second signal line, the first signal line and the second signal line comprising a first segment, a second segment, a twist segment conductively connected to the first segment and the second segment, and at least one dummy bit line extending in a first lateral direction, the at least one dummy bit line being adjacent to the first signal line or the second signal line in a third lateral direction perpendicular to the first lateral direction, wherein:

the first segment comprises a first portion of the first signal line and a first portion of the second signal line, the second segment comprises a second portion of the first signal line and a second portion of the second signal line, and the twist segment comprises a third portion of the first signal line and a third portion of the second signal line;

the first and second portions of the first signal line and the second signal line each extends in the first lateral direction; and the third portion of the first signal line is conductively connected to the first and second portions of the first signal line, and the third portion of the second signal line is conductively connected to the first and second portions of the second signal line, the third portion of the first signal line and the third portion of the second signal line each extending in a different lateral direction and being insulated from each other, projections of the third portions of the first signal line and the second signal line intersecting with each other on a lateral plane.

12. The memory device of claim 11, wherein the one of the third portion of the first signal line and the third portion of the second signal line is located in a first plane, and another one of the third portion of the first signal line and the third portion of the second signal line is located in a second plane different from first plane.

13. The memory device of claim 12, wherein
the first plane comprises a first metal layer in which the first and second portions of the first signal line and the second signal line are located; and
the second plane comprises at least one of a second metal layer different from the first metal layer, or a conductive layer on a substrate.

14. The memory device of claim 13, wherein the conductive layer comprises at least one of a doped region on the substrate, a silicide layer on the substrate, or a layer of gate electrode material of a transistor on the substrate.

15. The memory device of claim 11, wherein the first and second portions of the first signal line and the second signal line each extends in a second lateral direction different from the first lateral direction.

16. The memory device of claim 11, wherein the first signal line and the second signal line are bit lines.

17. A memory device, comprising:
a bit line group comprising: a first bit line and a second bit line each extending in a first lateral direction, the first bit line and the second bit line being intertwined with each other at a first location; and
at least one dummy bit line extending in the first lateral direction, the at least one dummy bit line being adjacent to the bit line group in a second lateral direction perpendicular to the first lateral direction, wherein
in the second lateral direction, the first bit line comprises at least a first portion above the second bit line, and at least a second portion below the second bit line.

18. The memory device of claim 17, further comprising a second bit line group comprising a third bit line and a fourth bit line each extending in the first lateral direction, the third bit line and the fourth bit line being intertwined with each other at a second location, wherein:
in the second lateral direction, the third bit line comprises at least a first portion above the fourth bit line, and at least a second portion below the fourth bit line; and
the second location is staggered with the first location in the first lateral direction.

* * * * *